United States Patent
Barth et al.

(10) Patent No.: US 6,781,830 B2
(45) Date of Patent: Aug. 24, 2004

(54) METHODS AND SYSTEMS OF HEAT TRANSFER FOR ELECTRONIC ENCLOSURES

(75) Inventors: Michael K. Barth, Shakopee, MN (US); Charles G. Ham, Mound, MN (US); Gene Tennis, Inver Grove Heights, MN (US); Matthew Kusz, Minneapolis, MN (US); Chad J. Sjodin, Shakopee, MN (US); Matthew Ferris, Carver, MN (US); Cyle D. Petersen, Belle Plaine, MN (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/289,132

(22) Filed: Nov. 5, 2002

(65) Prior Publication Data

US 2004/0085728 A1 May 6, 2004

(51) Int. Cl.[7] .................................................. H05K 7/20
(52) U.S. Cl. ...................... 361/688; 165/80.3; 165/185; 361/754; 361/756; 361/759; 361/797; 361/798; 361/801; 361/802; 361/690; 361/704; 361/715
(58) Field of Search .................... 211/41.17; 312/223.1; 361/682–690, 704–710, 715, 719–720, 752, 754, 756, 758–759, 796–797, 801–804, 740–744, 747; 454/184

(56) References Cited

U.S. PATENT DOCUMENTS

| | | | |
|---|---|---|---|
| 2,737,579 A | 3/1956 | Wehrlin et al. | |
| 2,796,559 A | 6/1957 | Fleucht | |
| 2,833,966 A | 5/1958 | Goodier et al. | |
| 2,876,277 A | 3/1959 | Badger et al. | |
| 3,087,095 A | 4/1963 | McConkey, Jr. et al. | |
| 3,135,321 A | 6/1964 | Butt et al. | |
| 3,366,171 A | 1/1968 | Scharli | |

(List continued on next page.)

FOREIGN PATENT DOCUMENTS

| | | |
|---|---|---|
| EP | 1 041 002 | 10/2000 |
| GB | 2 193 552 | 2/1988 |
| JP | 58-634 | 6/1981 |
| JP | 58-105187 | 7/1983 |
| JP | 60 79834 | 5/1985 |
| JP | 60-26936 | 2/1987 |
| JP | 62-67936 | 3/1987 |
| JP | 62-79404 | 4/1987 |
| JP | 2-4287 | 1/1990 |
| JP | 2-166798 | 6/1990 |
| JP | 7-177645 | 7/1995 |
| JP | 8-65868 | 3/1996 |

OTHER PUBLICATIONS

Gary Gustine et al., U.S. patent application No. 09/804,129, "Mechanical Housing", filed Mar. 12, 2001.
Gary Gustine et al., U.S. patent application No. 09/918,989, "Clamping Case", filed Jul. 31, 2001.
Gary Gustine et al., U.S. patent application No. 09/919,006, "Clamping Receptacle", filed Jul. 31, 2001.
Michael Sawyer et al., U.S. patent application No. 10/155,050, "Housings for Circuit Cards", filed May 24, 2002.

(List continued on next page.)

*Primary Examiner*—Gregory Thompson
(74) *Attorney, Agent, or Firm*—Fogg and Associates, LLC; Laura A. Ryan

(57) ABSTRACT

An electronics enclosure is provided. The enclosure includes a modular card cage adapted to receive one or more electronic circuit cards and a heat sink adapted to protrude through an opening of an enclosure and couple to the modular card cage. The modular card cage and the heat sink provide an isolated heat transfer path for heat, produced by each of the one or more electronic circuit cards, to be removed from the enclosure.

97 Claims, 18 Drawing Sheets

U.S. PATENT DOCUMENTS

| | | |
|---|---|---|
| 3,467,891 A | 9/1969 | Mogle |
| 3,487,267 A | 12/1969 | Winston et al. |
| 3,697,929 A | 10/1972 | Konewko et al. |
| 3,767,974 A | 10/1973 | Donovan, Jr. et al. |
| 3,809,798 A | 5/1974 | Simon |
| 3,997,819 A | 12/1976 | Eggert et al. |
| 4,172,212 A | 10/1979 | Heinzer |
| 4,184,539 A | 1/1980 | Rein |
| 4,259,843 A | 4/1981 | Kausch |
| 4,301,494 A | 11/1981 | Jordan |
| 4,449,576 A | 5/1984 | Baum et al. |
| 4,528,615 A | 7/1985 | Perry |
| 4,547,833 A | 10/1985 | Sharp |
| 4,559,790 A | 12/1985 | Houston |
| 4,564,061 A | 1/1986 | Rauth et al. |
| 4,656,559 A | 4/1987 | Fathi |
| 4,662,002 A | 4/1987 | Davis et al. |
| 4,679,250 A | 7/1987 | Davis et al. |
| 4,777,561 A | 10/1988 | Murphy et al. |
| 4,805,482 A | 2/1989 | Boda |
| 4,815,913 A | 3/1989 | Hata et al. |
| 4,849,858 A * | 7/1989 | Grapes et al. .............. 361/708 |
| 4,858,068 A | 8/1989 | Bitller et al. |
| 4,858,070 A | 8/1989 | Buron et al. |
| 4,953,058 A | 8/1990 | Harris |
| 4,962,444 A * | 10/1990 | Niggemann ................ 361/702 |
| 4,962,445 A | 10/1990 | Pelet et al. |
| 4,987,978 A | 1/1991 | Jungersen |
| 5,019,939 A | 5/1991 | Reimer |
| 5,045,971 A | 9/1991 | Ono et al. |
| 5,048,793 A | 9/1991 | Mefford et al. |
| 5,089,935 A | 2/1992 | Ito |
| 5,105,337 A | 4/1992 | Bitller et al. |
| 5,267,122 A | 11/1993 | Glover et al. |
| 5,309,315 A | 5/1994 | Naedel et al. |
| 5,329,425 A | 7/1994 | Leyssens et al. |
| 5,424,916 A | 6/1995 | Martin |
| 5,432,682 A * | 7/1995 | Giehl et al. ................. 361/796 |
| 5,519,573 A | 5/1996 | Cobb et al. |
| 5,642,264 A | 6/1997 | Cantrell |
| 5,825,621 A | 10/1998 | Giannatto et al. |
| 5,842,514 A | 12/1998 | Zapach et al. |
| 5,896,268 A | 4/1999 | Beavers |
| 5,946,193 A | 8/1999 | Hendrix et al. |
| 5,995,378 A | 11/1999 | Farnworth et al. |
| 6,002,588 A | 12/1999 | Vos et al. |
| 6,038,129 A | 3/2000 | Falaki et al. |
| 6,045,140 A | 4/2000 | Morris, Jr. |
| 6,104,611 A | 8/2000 | Glover et al. |
| 6,118,662 A | 9/2000 | Hutchinson et al. |
| 6,209,631 B1 | 4/2001 | Garcia-Ortiz |
| 6,289,678 B1 | 9/2001 | Pandolfi |
| 6,292,556 B1 | 9/2001 | Laetsch |
| 6,295,208 B1 | 9/2001 | Murchison et al. |
| 6,310,772 B1 | 10/2001 | Hutchinson et al. |
| 6,381,146 B1 | 4/2002 | Sevier |
| 6,396,691 B1 | 5/2002 | Pagnozzi |
| 6,404,637 B2 | 6/2002 | Hutchison et al. |
| 6,406,312 B1 | 6/2002 | Heitkamp |
| 6,430,044 B2 | 8/2002 | Hutchinson et al. |
| 6,493,236 B1 | 12/2002 | Momiyama et al. |
| 6,510,223 B2 | 1/2003 | Laetsch |
| 6,535,603 B2 | 3/2003 | Laetsch |
| 6,587,339 B1 | 7/2003 | Daniels et al. |
| 6,611,426 B2 | 8/2003 | Hutchinson et al. |
| 6,628,521 B2 * | 9/2003 | Gustine et al. ............. 361/704 |

OTHER PUBLICATIONS

Abacon Telecommunications, HDSL Low Capacity Repeater Case, 1 pg., date unknown.

Abacon Telecommunications, HDSL High Capacity Repeater Case, 2 pgs., date unknown.

Circa Enterprises, Inc. "Digital Repeater Housings—HDSL Repeater", 2 pgs., 2000.

Circa Enterprises, Inc. "Digital Repeater Housings—T1 Repeater", 2 pgs., 2000.

"Hardened Telecom Enclosures for Optimal Thermal Management of Electronics", SPC TelEquip, pp. 1–20, Date Unknown.

Seri Lee, "How to Select a Heat Sink," Electronics Cooling, 9 pgs., Oct. 6, 2000.

Joe Ricke Sr., "Managing Heat in Electronic Enclosures," Electronic Packaging & Production, pp. 87–88, 90, 92, vol. 36, No. 2, Feb. 1996.

Su, "Case for Mounting Slidably a Data Storage Medium in a Computer Housing" US Patent Publication No. US 2002/0141153 A1, Filed Jul. 9, 2001, Published Oct. 3, 2002, (9 pgs.).

* cited by examiner

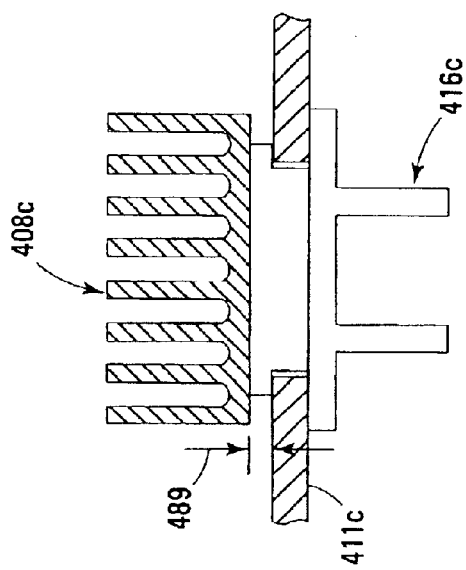
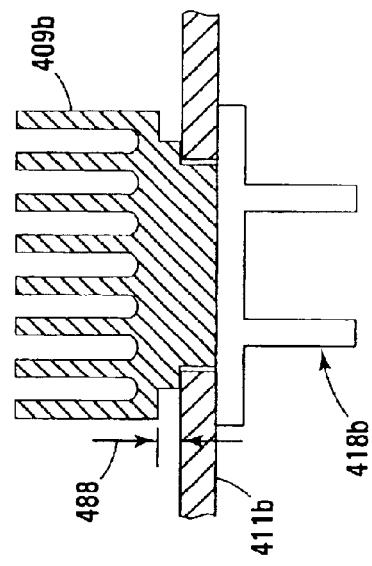
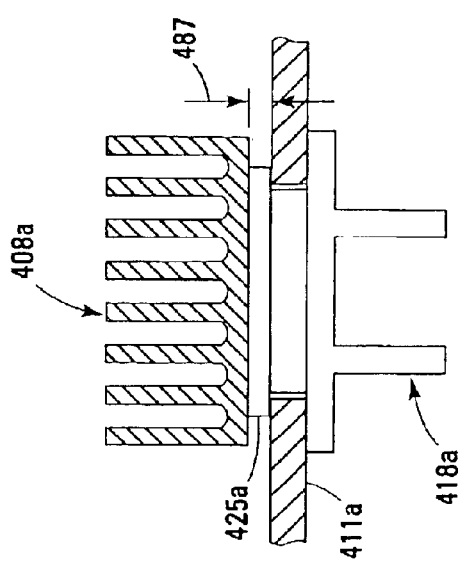
Fig. 4a
Fig. 4b
Fig. 4c

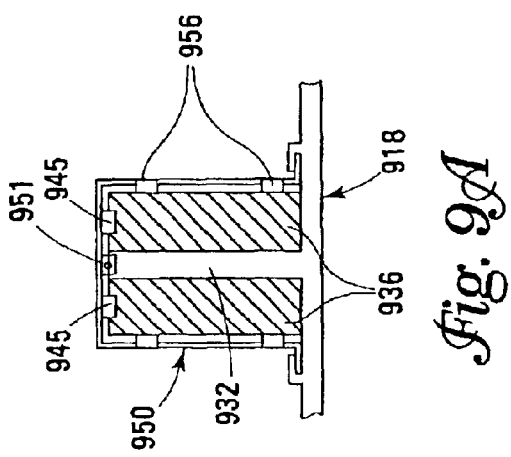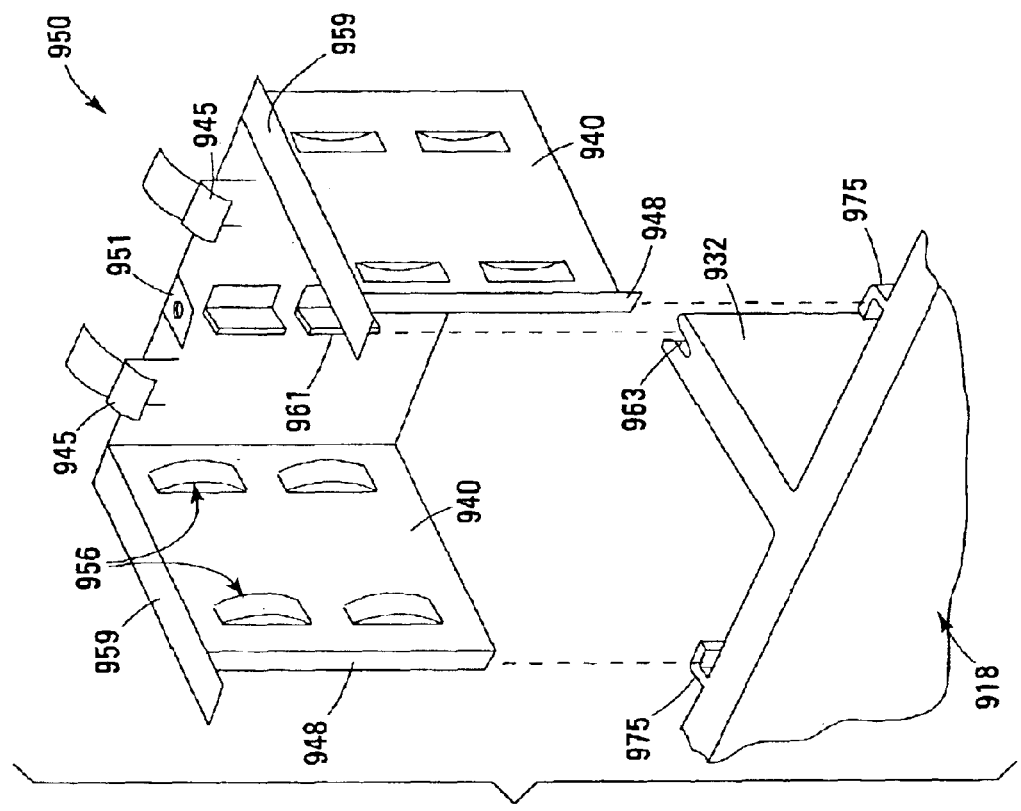

METHODS AND SYSTEMS OF HEAT TRANSFER FOR ELECTRONIC ENCLOSURES

TECHNICAL FIELD

The present invention relates to electronic equipment enclosures such as telecommunications repeater housings. More particularly, the invention relates to methods and systems of heat transfer for electronic enclosures.

BACKGROUND

Electronic cards such as telecommunications repeaters and other electronic equipment are often housed in enclosures that are required to bear the elements such as sun, rain, salt fog, pollution, heat as well as fire. These enclosures can also be subjected to partial or total submersion in water and are required to be sealed against a pressure differential. These sealed enclosures are also required to remove energy, usually in the form of heat, generated by the electronic equipment in the enclosures. Many enclosures trap heat generated by the electronics. The build up of heat within these enclosures can cause significant problems for the electronic equipment by challenging the temperature limits of the electronic devices and causing device failure.

Often enclosures include card cages that collect and release heat into the enclosure environment and the heat becomes trapped. These card cages are typically single structures that continually exchange heat between the cards and the air within the enclosures without substantially moving the heat to the exterior of the enclosure. Because the card cage is one structure the structure becomes saturated with energy and can increase the heat build up within the enclosure.

The build up of heat within the enclosures can be further exasperated by enclosures that are made of materials having poor conductive properties. For many reasons such as weight, corrosion, and safety, telecommunications enclosures are often made of composites that have poor conductive properties. As a result composite enclosures severely limit the amount of heat transfer through the enclosure. Some applications provide a series of materials through which heat is transferred from the electronics devices to the ambient air. For example some electronic enclosures transfer heat from multiple electronic cards to a single card cage to a conductive liner which protrudes out through openings in the enclosure to one or more heat sinks. Other enclosures include a conductive cover and heat is conducted to the cover for dissipation to the ambient air.

Electronic devices are often lined up in rows and columns within card cages where the path from the inner cards to the ambient air is significantly longer than cards situated along an edge of the card cage. This causes significant heat build up for the inner cards. Further, good heat transfer requires consistent and preferably direct contact between transfer materials e.g. the repeater and card cage. It is difficult to get and keep the electronics cards in contact with the card cage. If good contact is not maintained poor heat transfer results and the rate of failure for the electronic devices is high. Some enclosures include active devices such as cams that require a technician or user to engage the device. The active devices force the electronic cards and card cage into contact but are prone to failure and are often overlooked by technicians and not engaged. Additionally, electronic cards come in many different styles and contact with heat transfer members do not take into consider open frame repeaters where the repeaters are encased in a box or frame with a portion of the sides removed.

Electronics cards are also susceptible to vibration and gravity. Cards are often retained in an enclosure only by an electrical connection such as insertion into an electrical socket. Due to vibration during shipping and operation the cards can become loose and dislodged from the electrical connectors. The cards can also be loosened when subjected to mounting locations that force the electronic cards to "hang" from the electrical socket. The use of active retention devices, such as cams, requires human intervention and is not reliable. Loose connections cause operation errors and result in time consuming and costly service calls.

Electronic equipment enclosures such as repeater housings are often heavy and cumbersome. The enclosures are difficult to carry and maneuver in small places such as mounting on telephone poles or into manhole compartments. Any enclosure which exceeds a set weight is required to be equipped with a lifting mechanism for attaching hoisting cables or chains. Often enclosures are lifted using one of the mounting feet attached to the exterior of the enclosure. The stress caused by the weight of the enclosure can lead to pull out of the mounting foot, damage to the mounting foot and/or structural damage to the enclosure.

The need for additional items such as conductive liners adds to the weight and cost of the enclosures. Some liners are over molded and fit tight within the enclosure and as a result introduce stress on the liners. The enclosure and the liner are made of different materials that expand and contract at different rates. This expansion and contraction causes potential stress of these components and may cause the mean time between failures of the equipment to decrease. Over molding large metal parts is a very difficult process because of the difference in material shrinkage and mold operator alignment introduce tool friction and wear issues. Further, the addition of a liner adds another layer to tolerance stacking when assembling the enclosure.

In addition, enclosures are subjected to costly replacement when the heat sinks or other exterior components are deteriorated by corrosion or otherwise damaged. Complete replacement is costly and time consuming often causing a drop in service for subscribers. Repeater enclosures are often pressurized to aid in protection from the elements. Proper sealing of the enclosures is always a concern. In some enclosures over molded liners have been used to provide a seal between the liner and the enclosure. The added weight of these liners adds to the difficulty in installation of the enclosures.

For the reasons stated above, and for other reasons stated below which will become apparent to those skilled in the art upon reading and understanding the present specification, there is a need in the art for an improved enclosure for electronics equipment that overcomes the above noted imitations.

SUMMARY

The above-mentioned problems with enclosures for electronics equipment and other problems are addressed by embodiments of the present invention and will be understood by reading and studying the following specification.

An electronics enclosure is provided. The enclosure includes a modular card cage adapted to receive one or more electronic circuit cards and a heat sink adapted to protrude through an opening of an enclosure and couple to the modular card cage. The modular card cage and the heat sink provide an isolated heat transfer path for heat, produced by each of the one or more electronic circuit cards, to be removed from the enclosure.

In another embodiment, an electronics enclosure is provided. The enclosure includes one or more walls having at least one aperture, a plurality of modular card cages, wherein each card cage is adapted to receive one or more electronics cards; and a plurality of heat sinks. Each heat sink is adapted to protrude through one of the apertures and to couple to one of the plurality of modular card cages. Each aperture provides a direct path through which energy produced by the one or more electronics cards is removed from the enclosure.

In one embodiment, a heat transfer module is provided. The heat transfer module includes a modular card cage adapted to couple to one or more electronic circuit cards, an interface adapted to couple with the modular card cage, and heat sink integral with the interface. The heat transfer module provides isolated heat transfer paths from the one or more electronic circuit cards to the heat sink.

In one embodiment, a method for transferring heat from a circuit card is provided. The method comprises conducting heat from the circuit card to a card cage that is in contact with the circuit card and conducting the heat from the card cage to a heat sink. The heat sink is in contact with the card cage and extends through an aperture in a housing containing the card cage from an exterior to an interior of the housing. The heat sink is removably attached to the housing so as to seal the aperture against a pressure differential.

BRIEF DESCRIPTION OF THE DRAWINGS

FIG. 4a is an illustration of a sectional view of one embodiment of a frame and a heat transfer module for an electronic equipment enclosure according to the teachings of the present invention.

FIG. 4b is an illustration of a sectional view of another embodiment of a frame and a heat transfer module for an electronic equipment enclosure according to the teachings of the present invention.

FIG. 4c is an illustration of a sectional view of another embodiment of a frame and a heat transfer module for an electronic equipment enclosure according to the teachings of the present invention.

FIG. 9a is an illustration of a top view of one embodiment of a compression retainer according to the teachings of the present invention.

FIG. 9b is an illustration of an isometric view of one embodiment of a compression retainer according to the teachings of the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide improvements in heat transfer for electronic equipment enclosures such as telecommunications repeater housings. The present invention provides efficient systems and methods of removing heat from electronic equipment enclosures. Embodiments of the present invention provide isolated heat transfer paths for electronics equipment within the electronics enclosure.

Figure 1:
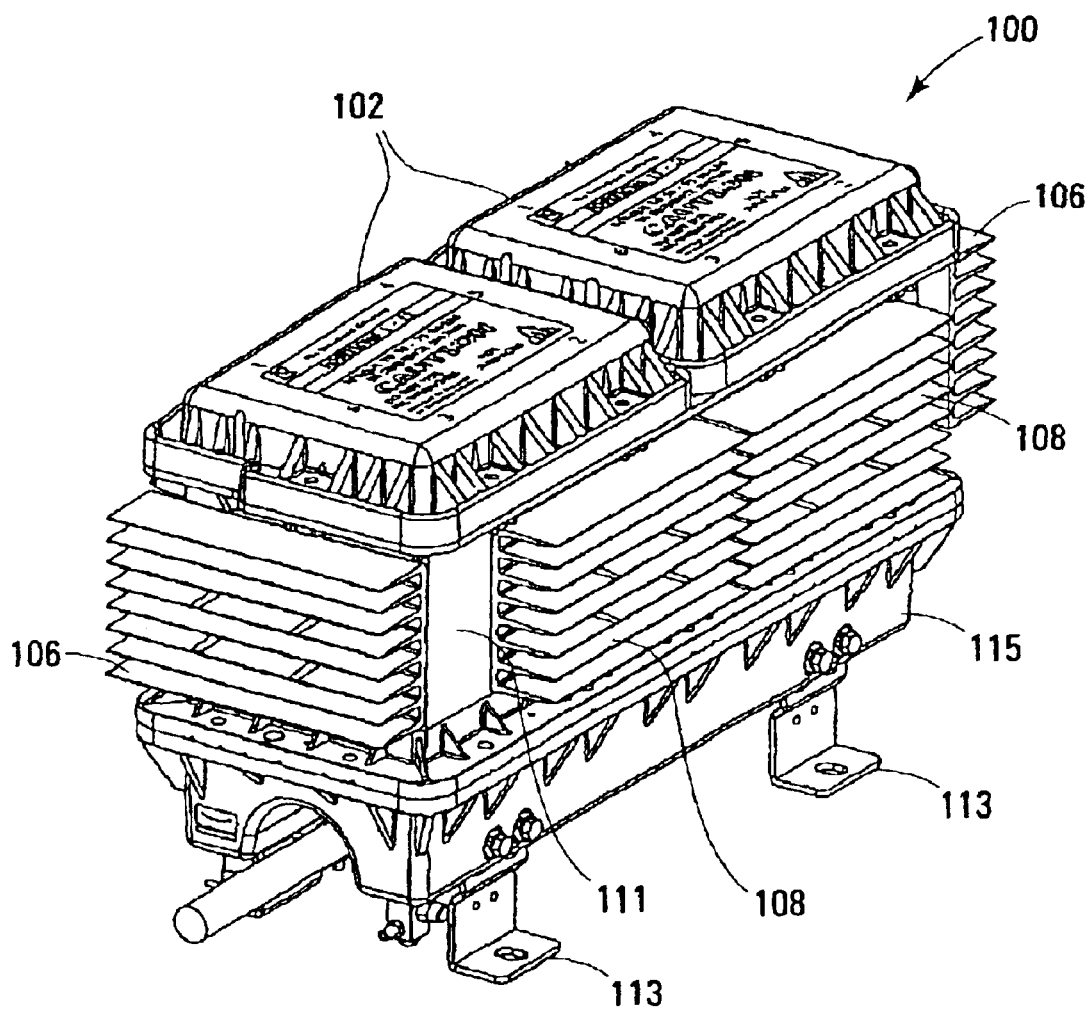
FIG. 1 is an illustration of one embodiment of an electronic equipment enclosure according to the teachings of the present invention.

FIG. 1 is an illustration of one embodiment of an electronic equipment enclosure, indicated generally at 100, according to the teachings of the present invention. In one embodiment, enclosure 100 is a telecommunication's repeater housing. In one embodiment, housing 100 includes frame 111 attached to one or more covers 102 and base 115. The base 115 having mounting feet 113 attached thereto. Housing 100 further includes field-replaceable heat sinks 106 and 108. In one embodiment, heat sinks 106 are attached on opposing ends of frame 111. In one embodiment, heat sinks 108 are attached to opposing sides of frame 111.

In one embodiment, base 115, frame 111 and covers 102 are manufactured by injection mold. In one embodiment, the injection molding is accomplished using thermoplastic resins. Frame 111 is made of a substantially thermally nonconductive material. In one embodiment, the material is a polymer, e.g. a thermal set polymer, a thermal plastic polymer or the like.

Electronic cards such as telecommunications repeaters and other electronic equipment are often housed in enclosures that are required to bear the elements such as sun, rain, salt fog, pollution, heat as well as fire. Telecommunications equipment enclosures are often required to be sealed against a pressure differential. These sealed enclosures are also required to dissipate energy generated by the electronic cards. Many enclosures trap heat generated by the electronics. The build up of heat within these enclosures can cause significant problems for the electronic equipment by pushing the temperature limits of the electronic devices and causing device failure.

Housing 100 provides an enclosure for electronic cards and protects them from the environment, e.g. water, heat, sun, salt fog, temperature extremes and the like. In one embodiment, housing 100 is sealed against a pressure differential.

Figure 2:
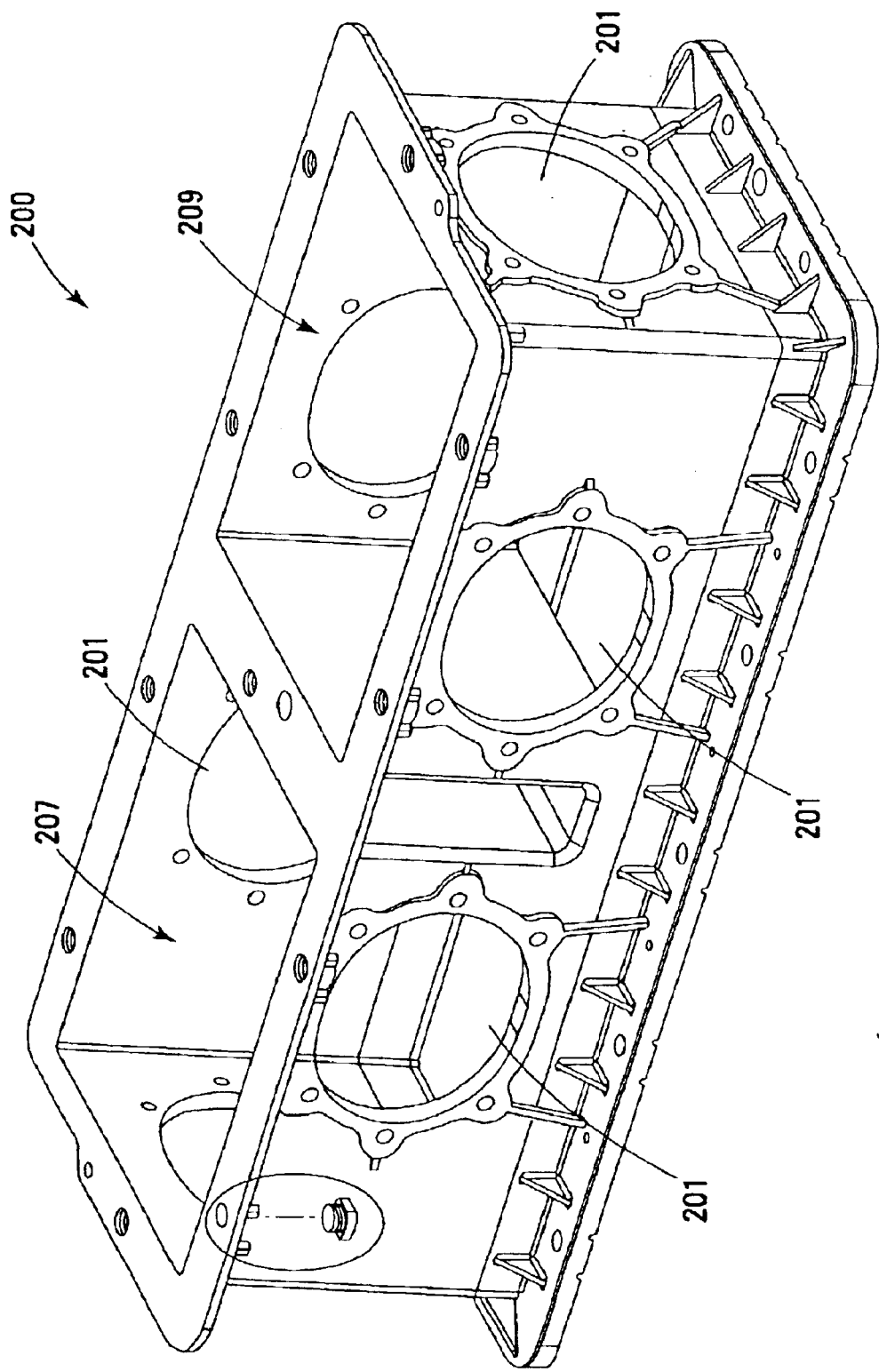
FIG. 2 is an illustration of one embodiment of a frame of an electronic equipment enclosure according to the teachings of the present invention.

FIG. 2 is an illustration of one embodiment of a frame, shown generally at 200, for an electronic equipment enclosure according to the teachings of the present invention. In one embodiment, frame 200 includes first and second chambers 207 and 209, respectively. Each of chambers 207 and 209 includes openings 201 through the side and end walls of frame 200. Each chamber 207 and 209 is adapted to contain electronics equipment. In one embodiment, the electronics equipment includes repeaters. In one embodiment, frame 200 is made of a substantially thermally non-conductive material. In one embodiment, the material is a polymer, e.g. a thermal set polymer, a thermal plastic polymer or the like.

Often equipment enclosures trap heat generated by the electronics within the enclosure environment. Enclosures also include card cages for the electronic equipment. These card cages are typically single structures that continually exchange heat between the cards and the air within the enclosures without substantially moving the heat to the exterior of the enclosure. Because the card cage is a single structure the structure becomes saturated with energy and increases the heat build up within the enclosure. Embodiments of the present invention provide multiple modular card cages that are independent structures and provide isolated heat transfer paths for small sets of electronic circuit cards.

Isolated heat transfer paths reduce electronic card device failure, due to heat build up, by providing a direct path to remove heat from an equipment enclosure for each electronic card. Embodiments of the present invention provide substantially equal heat transfer paths for each of the electronic cards in the enclosure.

Figure 3:
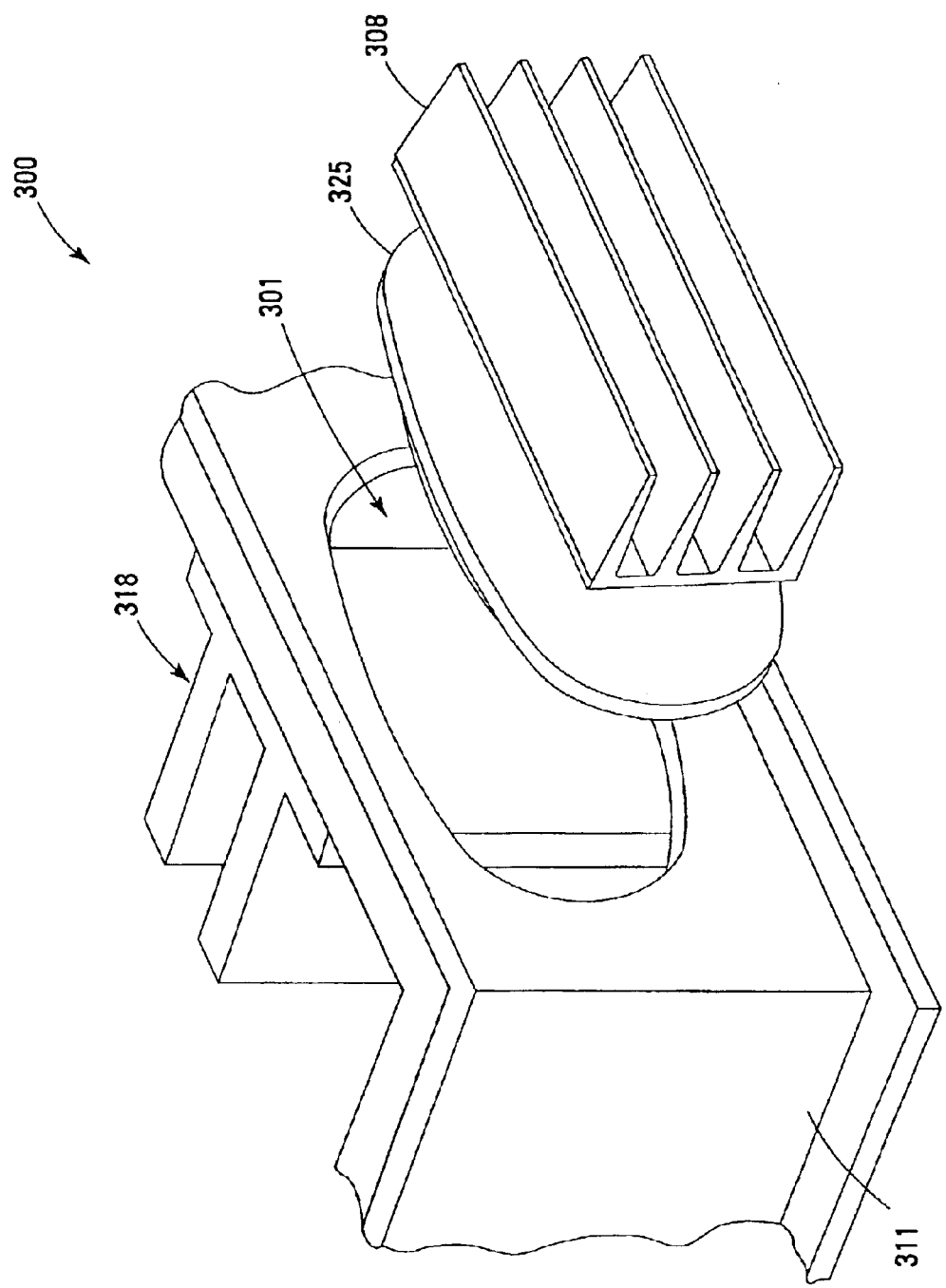
FIG. 3 is an illustration of an expanded view of one embodiment of a portion of a frame of an electronic equipment enclosure and a modular card cage according to the teachings of the present invention.

FIG. 3 is an illustration of one embodiment of an expanded view of a frame portion of an electronic equipment enclosure, shown generally at 300, according to the teachings of the present invention. In this embodiment, frame 311 includes an opening 301 through a wall of frame 311. An interface 325 is adapted to couple with heat sink 308 and modular card cage 318 to create a heat transfer module providing multiple isolated heat transfer paths.

Modular card cage 318 is adapted to couple with one or more electronics cards and provide isolated paths for heat generated by the electronics to escape from the enclosure that frame 311 is part of, such as repeater housing 100 of FIG. 1. In one embodiment, interface 325 and heat sink 308 are separate components that are adapted to couple together. In another embodiment, interface 325 and heat sink 308 are formed as an integral component. In one embodiment, card cage 318, interface 325, and heat sink 308 are made of a thermally conductive material and frame 311 is made of a thermally non-conductive material. In one embodiment, the conductive material includes one or more of copper, aluminum, stainless steel or the like.

In one embodiment, modular card cage 318, interface 325, and heat sink 308 are fabricated by extrusion. In one embodiment, the extrusion is through an aluminum die. In another embodiment, modular card cages 318, interface 325, and heat sink 308 are machined.

One embodiment of the invention FIG. 4a is an illustration of a sectional view of one embodiment of a frame and a heat transfer module for an electronic equipment enclosure according to the teachings of the present invention. In this embodiment, a modular card cage 418a is coupled to an interface 425a that is physically and thermally coupled to heat sink 408a. Card cage 418a, interface 425a, and heat sink 408a form a heat transfer module for electronics equipment mounted within frame 411a. The heat transfer module provides an isolated heat transfer path for each electronics card in contact with card cage 418a. Frame 411a includes an opening through which interface 425a extends. Interface 425a is adapted to physically and thermally couple to card cage 418a and heat sink 408a. In this embodiment, heat sink 408a and interface 425a are removable and field replaceable components. Heat sink 408a is not in direct contact with the exterior of frame 411a as is illustrated by space 487.

FIG. 4b is an illustration of a sectional view of another embodiment of a frame and a heat transfer module for an electronic equipment enclosure according to the teachings of the present invention. In this embodiment, heat sink 409b is adapted to extend through an opening of frame 411b and physically and thermally couple to modular card cage 418b. Card cage 418b and heat sink 409b form a heat transfer module for electronics equipment mounted within frame 411b. The heat transfer module provides an isolated heat transfer path for each electronics card in contact with card cage 418b. In this embodiment, heat sink 409b is removable and field replaceable. Heat sink 409b is not in direct contact with frame 411b as illustrated by space 488.

FIG. 4c is an illustration of a sectional view of another embodiment of a frame and a heat transfer module for an electronic equipment enclosure according to the teachings of the present invention. In this embodiment, a modular card cage 416c is adapted to extend through an opening of frame 411c and physically and thermally couple to heat sink 408c.

Heat sink 408c and modular card cage 416c form a heat transfer module for electronics equipment mounted within frame 411c. The heat transfer module provides an isolated heat transfer path for each electronics card in contact with card cage 416c. In this embodiment, heat sink 408c is removable and field replaceable. Heat sink 408c is not in direct contact with frame 411c as illustrated by space 489.

Figure 4E:
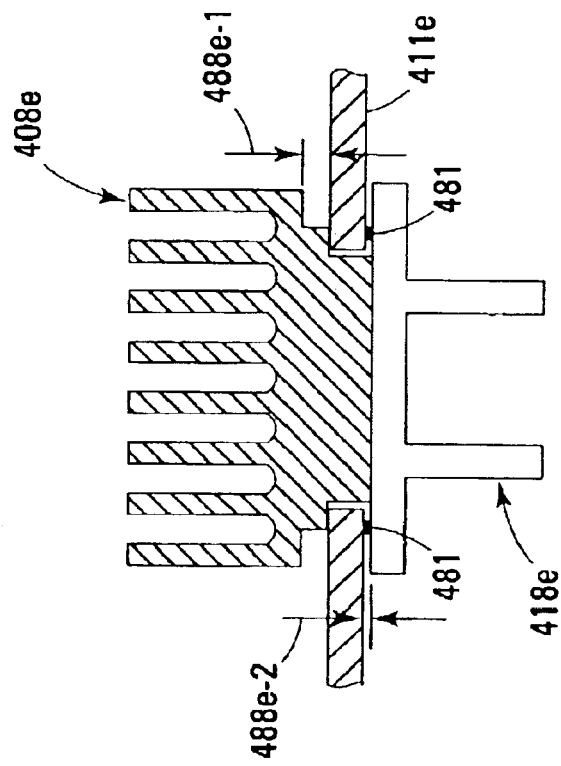
FIG. 4e is an illustration of a sectional view of another embodiment of a frame and a heat transfer module for an electronic equipment enclosure according to the teachings of the present invention.
Figure 4D:
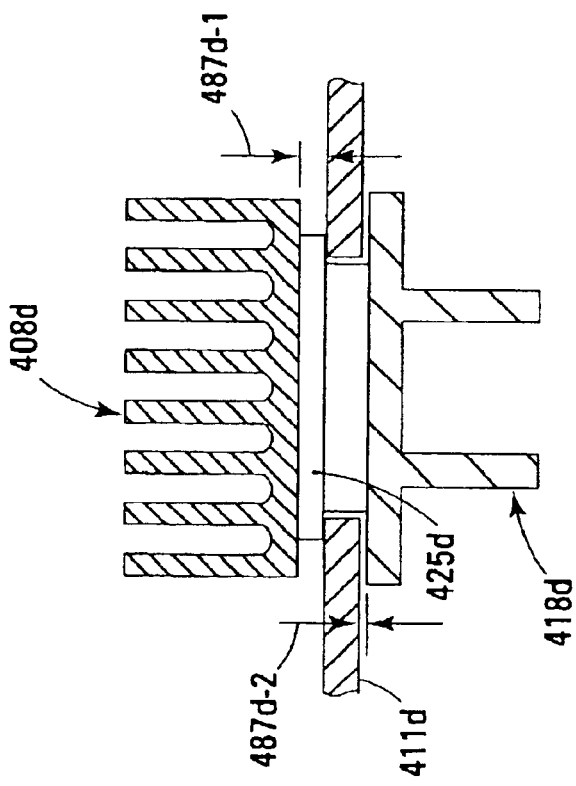
FIG. 4d is an illustration of a sectional view of another embodiment of a frame and a heat transfer module for an electronic equipment enclosure according to the teachings of the present invention.

FIG. 4d is an illustration of a sectional view of another embodiment of a frame and a heat transfer module for an electronic equipment enclosure according to the teachings of the present invention. In this embodiment, a modular card cage 418d is coupled to an interface 425d that is physically and thermally coupled to heat sink 408d. Card cage 418d, interface 425d, and heat sink 408d form a heat transfer module for electronics equipment mounted within frame 411d. The heat transfer module provides an isolated heat transfer path for each electronics card in contact with card cage 418d. Frame 411d includes an opening through which interface 425d extends. Interface 425d is adapted to physically and thermally couple to card cage 418d and heat sink 408d. In this embodiment, heat sink 408d and interface 425d are removable and field replaceable components. Heat sink 408d and card cage 418d are not in direct contact with frame 411d as is illustrated by spaces 487d-1 and 487d-2, respectively.

FIG. 4e is an illustration of a sectional view of another embodiment of a frame and a heat transfer module for an electronic equipment enclosure according to the teachings of the present invention. In this embodiment, heat sink 409e is adapted to extend through an opening of frame 411e and physically and thermally couple to modular card cage 418e. Card cage 418e and heat sink 409e form a heat transfer module for electronics equipment mounted within frame 411e. The heat transfer module provides an isolated heat transfer path for each electronics card in contact with card cage 418e. In this embodiment, heat sink 409e is removable and field replaceable. Heat sink 409e and card cage 418e are not in direct contact with frame 411e as is illustrated by spaces 488e-1 and 488e-2, respectively. In this embodiment, gasket 481 seals the opening of frame 411e from the environment and a pressure differential.

Figure 5A:
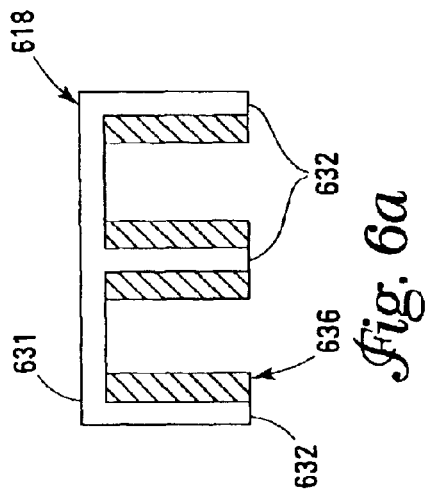
FIG. 5a is an illustration of a top view of one embodiment of a modular card cage according to the teachings of the present invention.

FIG. 5a is an illustration of a top view of one embodiment of a modular card cage, shown generally at 518, according to the teachings of the present invention. Card cage 518 is adapted to couple to up to four electronic cards 536. In one embodiment, card cage 518 is substantially shaped like a "U" having a base 531 and two legs 532. Legs 532 are each substantially perpendicular to base 531 and parallel to each other. Each leg 532 is adapted to couple with up to two electronic cards 536. Base 531 is adapted to couple with a heat sink or interface of a frame as described with respect to FIGS. 3 and 4 above. In another embodiment, modular card cage 518 is substantially "T" shaped and includes a single leg 532 adapted to couple with up to two electronic cards 536. This is illustrated in FIGS. 9a and 9b. Leg 532 is substantially perpendicular to base 531.

Figure 5B:
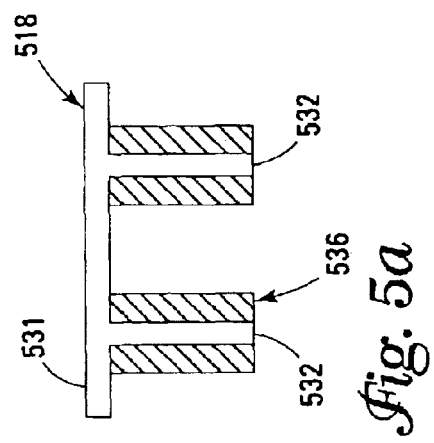
FIG. 5b is an illustration of an isometric view of one embodiment of modular card cage 518 of FIG. 5a according to the teachings of the present invention.

FIG. 5b is an illustration of an isometric view of one embodiment of modular card cage 518 of FIG. 5a.

Figure 6A:
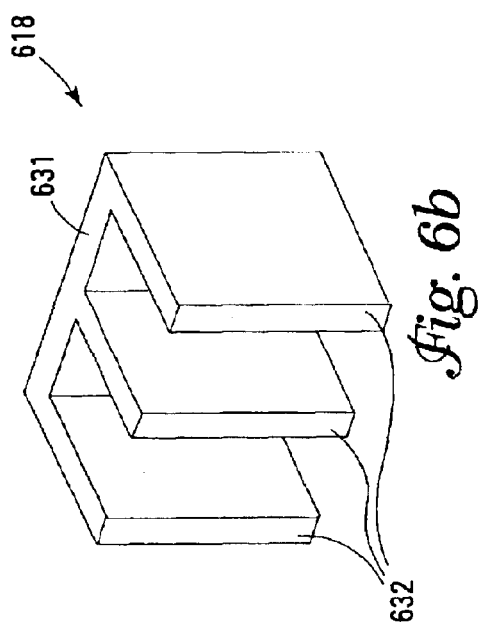
FIG. 6a is an illustration of a top view of another embodiment of a modular card cage according to the teachings of the present invention.

FIG. 6a is an illustration of a top view of another embodiment of a modular card cage, shown generally at 618, according to the teachings of the present invention. Card cage 618 is adapted to couple with up to four electronic cards 636. Card cage 618 is substantially shaped like an "E" having base 631 and three legs 632. Legs 632 are each substantially perpendicular to base 631 and parallel to each other. Each leg is adapted to couple with up to two electronic cards 636. Base 631 is adapted to couple with a heat sink or interface of a frame as described with respect to FIGS. 3 and 4 above.

Figure 6B:
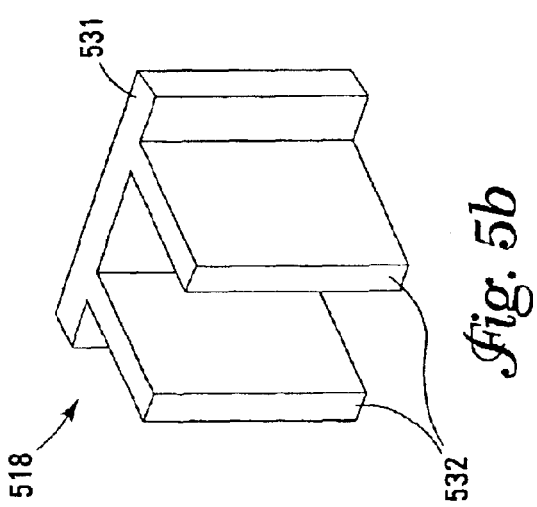
FIG. 6b is an illustration of an isometric view of one embodiment of modular card cage 618 of FIG. 6a according to the teachings of the present invention.

FIG. 6b is an illustration of an isometric view of one embodiment of modular card cage 618 of FIG. 6a.

Figure 7:
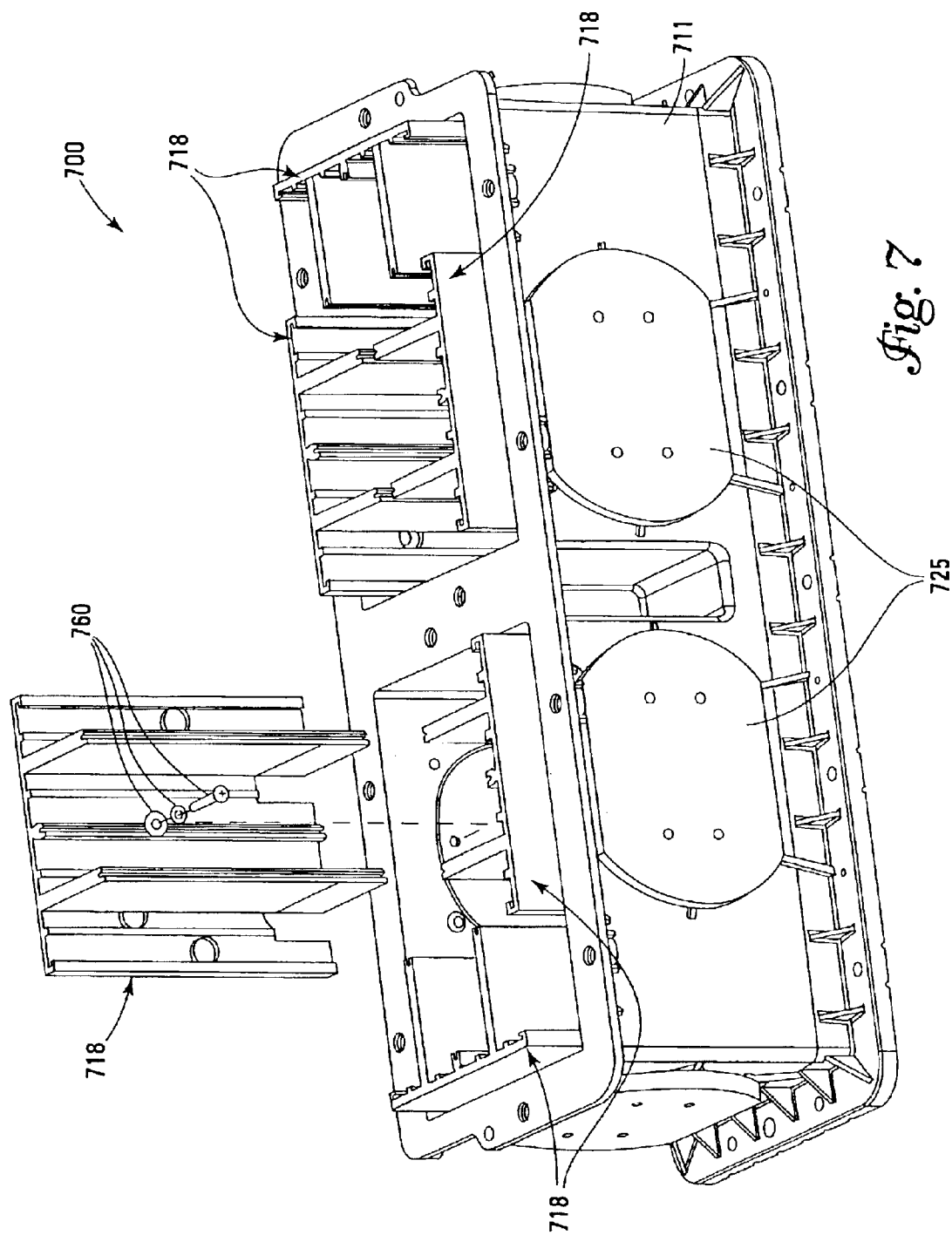
FIG. 7 is an illustration of one embodiment of a frame portion of an electronic equipment enclosure with a modular card cage according to the teachings of the present invention.

FIG. 7 is an illustration of one embodiment of a frame portion of an electronic equipment enclosure, shown generally at 700, according to the teachings of the present invention. Enclosure 700 includes frame 711 having multiple interfaces 725 that are each adapted to couple with modular card cage 718. Each modular card cage 718 is adapted to couple with up to four electronics cards. Isolated heat transfer paths for energy produced by electronics card to exit electronic equipment enclosure 700 are created through the combination of card cage 718, interface 725, and a heat sink, i.e., heat transfer module. In this embodiment, there are shown 6 heat transfer modules each providing isolated heat transfer paths for up to 4 electronic cards. The heat transfer modules provide direct isolated heat transfer paths for the energy from each of the electronic cards to be extracted from the enclosure environment to the ambient air. Each heat transfer module is separate from each other heat transfer module. Each heat transfer module provides isolated heat transfer paths for each electronic card in contact with an associated modular card cage 718. Each heat transfer module removes heat from a separate opening of frame 711.

In one embodiment, each modular card cage 718 is adapted to secure to an interface 725 via one or more fasteners 760. Fasteners 760 include screws, clamps, rivets or the like. Fasteners 760 aid in providing solid thermal contact between modular card cages 718 and interfaces 725.

Figure 8:
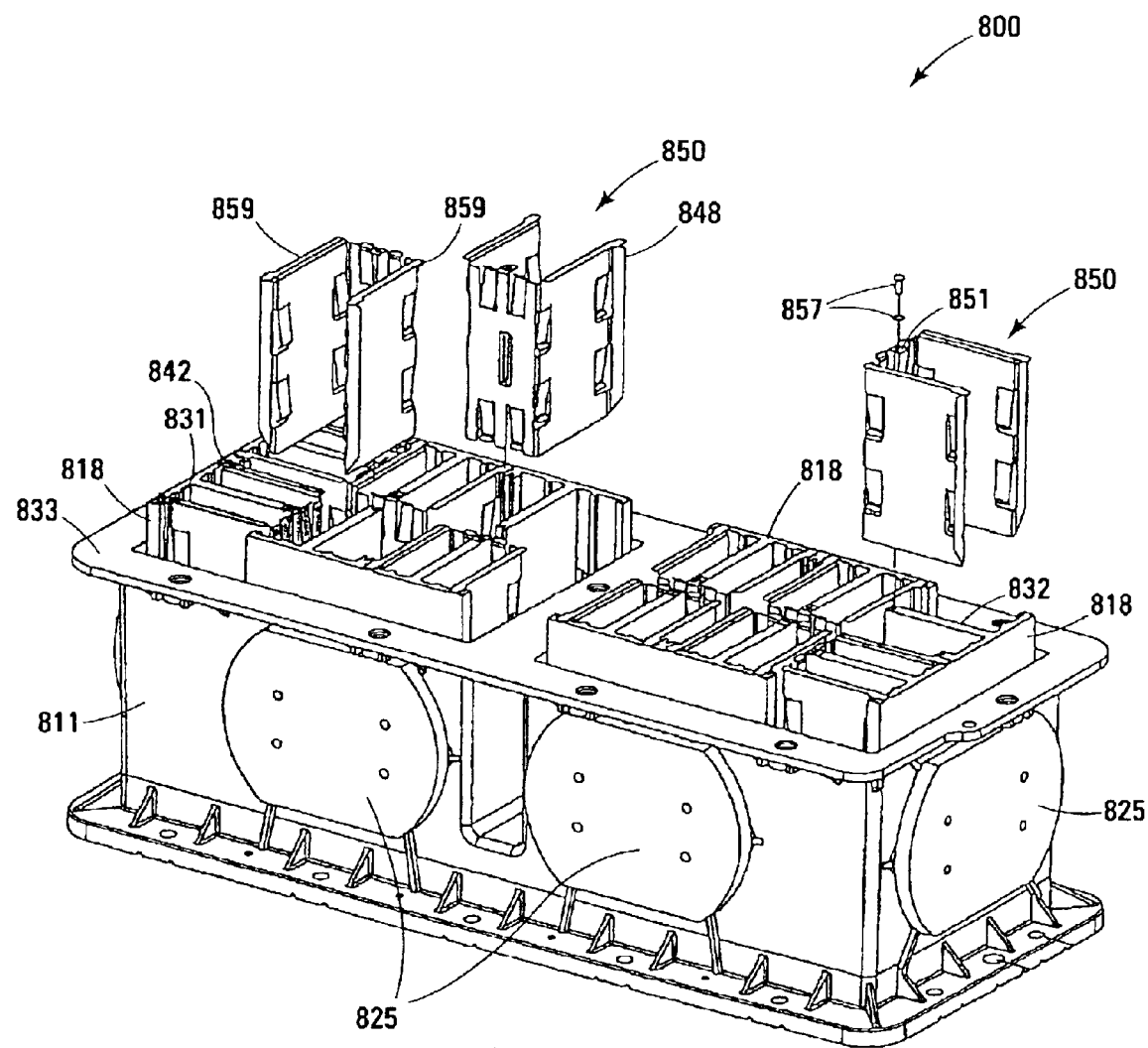
FIG. 8 is an illustration of one embodiment of a frame including heat transfer modules and compression retainers according to the teachings of the present invention.

FIG. 8 is an illustration of one embodiment of a frame including heat transfer modules and compression retainers, shown generally at 800, according to the teachings of the present invention. Efficient heat transfer requires consistent and preferably direct contact between transfer materials, e.g., electronic cards and card cages, and card cages and heat sinks. Embodiments of the present invention provide a way to get and keep electronics cards in contact with card cages 818. If good contact is not maintained poor heat transfer results and the rate of failure for the electronic devices is high. Active compression devices such as cams require a technician or user to engage the device. The active compression devices are prone to failure and are often overlooked by technicians. Additionally, electronic cards come in many different styles and contact with heat transfer members do not take into consider open frame repeaters where the repeaters are encased in a box or frame with a portion of the sides removed.

Contact between electronic cards and card cages 818 is accomplished by providing compression retainers 850. Enclosure 800 includes frame 811 having multiple modular card cages 818. Each card cage 818 is adapted to couple to interface 825. As shown in FIG. 8 compression retainers 850 are included to engage with a section of modular card cage 818. In this embodiment, two compression retainers 850 are required to provide card guides for up to 4 electronic cards. In one embodiment, each compression retainer 850 includes a spring stop 851 that is adapted to engage with a leg 832 of card cage 818. Leg 832 and spring stop 851 are adapted to receive a fastener 831. Once fastener 857 is engaged with leg 832 and spring stop 851 it secures compression retainer 850 to card cage 818. In one embodiment, compression retainer 850 includes one or more tabs 848 that engage with a groove of card cage 818. This will be described more fully with respect to FIG. 9 below. In one embodiment, compression retainer 850 includes lip edges 859. In one embodiment, each lip edge 859 includes an extension 842 that catches the upper surface 833 of the base 831 of modular card cage 818 and further stabilizes compression retainer 850. As a result the compression retainer 850 provides consistent contact between electronics cards and modular card cage 818.

FIG. 9a is an illustration of a top view of one embodiment of a compression retainer 950, according to the teachings of the present invention. In this embodiment, compression retainer 950 is engaged with two electronic cards 936 and presses each of electronic cards 936 into contact with leg 932 of card cage 918, according to the teachings of the present invention. In one embodiment, compression retainer 950 includes one or more electronic circuit card retainers 945 for each electronic circuit card 936. Retainers 945 secure each electronic card 936 into a slot defined by the engagement of card cage 918 and compression retainer 950. Once compression retainer 950 is emplaced, slots for receiving electronic cards 936 are defined. In one embodiment, electronic cards 936 are removed by releasing the repeater retainer 945.

FIG. 9b is an isometric view of compression retainer 950 illustrated in FIG. 9a, according to the teachings of the present invention. In one embodiment, compression retainer 950 includes tab 948 on each leg 940 of compression retainer 950. Each tab 948 is adapted to be received by a groove or channel 975 of card cage 918. In another embodiment, compression retainer 950 includes a force fit flange 961 that is adapted to engage with a channel 963 of card cage 918. In this embodiment, channel 963 is integral to leg 932 of card cage 918. In one embodiment, compression retainer 950 is made out of a flexible and resilient material such as spring steel or the like. In this embodiment, compression retainer 950 includes multiple pressure protrusions 956. Protrusions 956 are adapted to push and hold electronic cards 936 into contact with a leg 932 of card cage 918. There are many different types of electronics cards for use with this compression retainer 950. Pressure protrusions 956 may be aligned on legs 940 to provide the best contact between the electronics card 936 and leg 932 of card cage 918. In one embodiment, pressure protrusions 956 are placed as close to each edge of leg 940 to engage with the repeater housing. For example in one embodiment, electronic cards 936 are designed with a hollow frame surrounding the repeater electronics. In another embodiment, pressure protrusions 956 are placed on leg 940 to provide even pressure contact between electronic card 936 and leg 932 of card cage 918.

Electronics cards are susceptible to vibration and gravity. Cards are often retained only by an electrical connection such as insertion into an electrical socket. Due to vibration during shipping and operation the cards can become loose and dislodged from the electrical connectors. The cards can also be loosened when subjected to mounting locations that force the electronic cards to "hang" from the electrical socket. The use of active retention devices require human intervention and are not reliable. Loose connections cause operation errors and result in time consuming and costly service calls. Compression retainers 950 aid in solving these problems by engaging with card cages 918 to provide card guides for the insertion of electronic circuit cards. Compression retainers 950 keep a positive pressure on the electronic cards and provide consistent contact between the cards and card cages 818.

Compression retainers 950 allow for ease of assembly when mating with modular card cages 918. The force fit flanges 961 allow for a force fit with card cage 918. The force fit prevents vertical movement in the upward direction. Electronic cards are prevented from moving up and out of the connectors. Also electronic circuit card retainers 945 keep the cards within the defined slots. Pressure protrusions 956 help force the repeater against leg 932 of card cage 918 providing an efficient thermal transfer contact area.

Figure 9C:
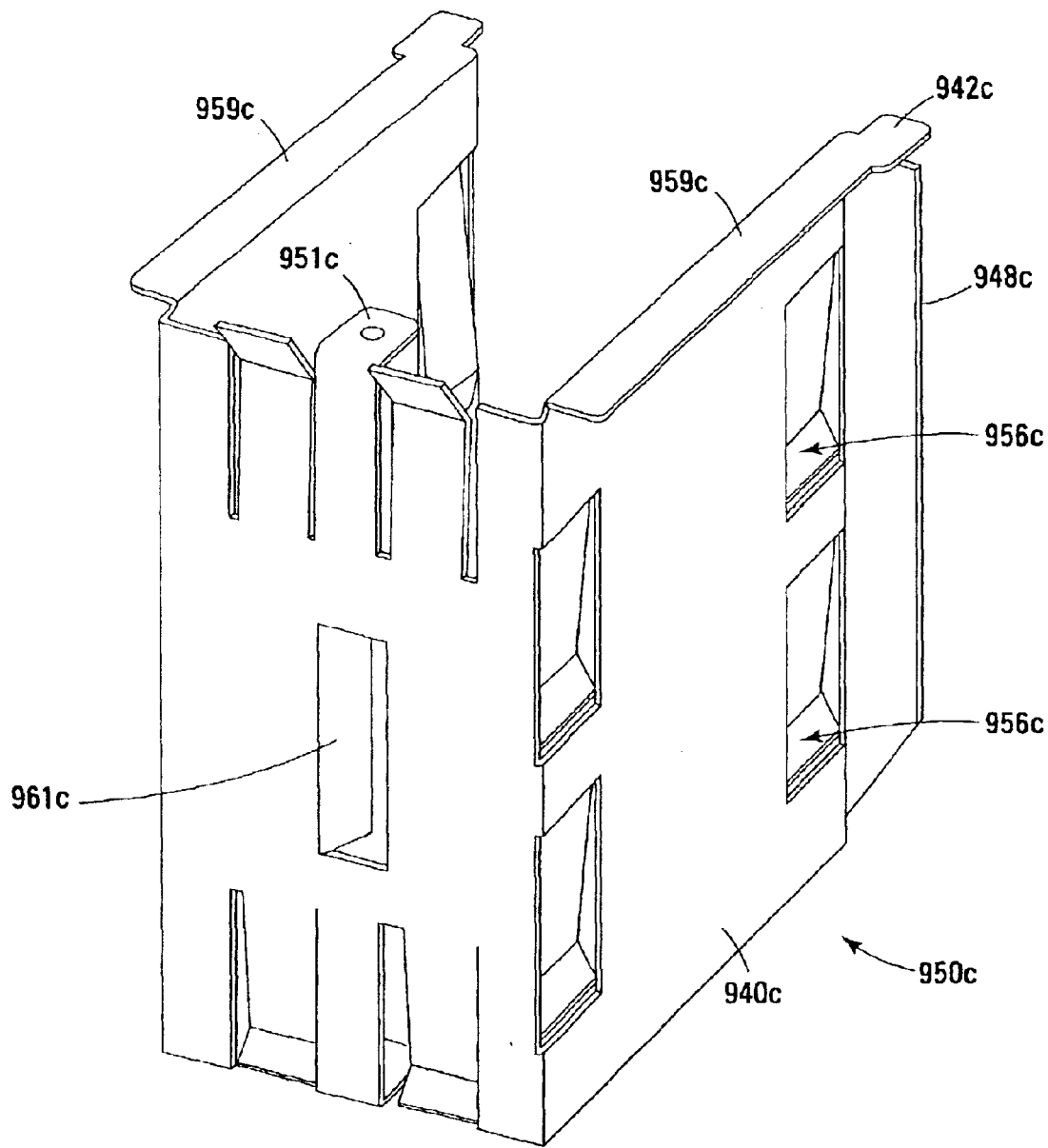
FIG. 9c is an illustration of another embodiment of a compression retainer according to the teachings of the present invention according to the teachings of the present invention.

FIG. 9c is an illustration of another embodiment of a compression retainer, shown generally at 950c, according to the teachings of the present invention according to the teachings of the present invention. In one embodiment, compression retainer 950c includes tab 948c on each leg 940c of compression retainer 950c. Each tab 948c is adapted to be received by a groove or channel of card cage (as described above with respect to FIG. 9b). In another embodiment, compression retainer 950 includes a force fit flange 961c that is adapted to engage with a channel of a card cage (as described above with respect to FIG. 9b). In one embodiment, compression retainer 950c is made out of a flexible and resilient material such as spring steel or the like. In this embodiment, compression retainer 950c includes multiple pressure protrusions 956c. Protrusions 956c are adapted to push and hold electronic cards into contact with a card cage.

In one embodiment, compression retainer 950c includes lip edges 959c. In one embodiment, each lip edge 959c includes an extension 942c that catches the base of a card cage to stabilize compression retainer 950c as discussed with respect to FIG. 8 above. In one embodiment, compression retainer 950c further includes spring stop 951c that is adapted to engage with a leg of a card cage as discussed with respect to FIG. 8 above. Spring stop 951c is adapted to receive a fastener.

In one embodiment, compression retainer 950c includes one or more electronic circuit card retainers 945c. Retainers 945c secure electronic circuit cards into a slot defined by the engagement of card cage with compression retainer 950c. In one embodiment, electronic cards are removed by releasing retainer 945c.

Figure 10:
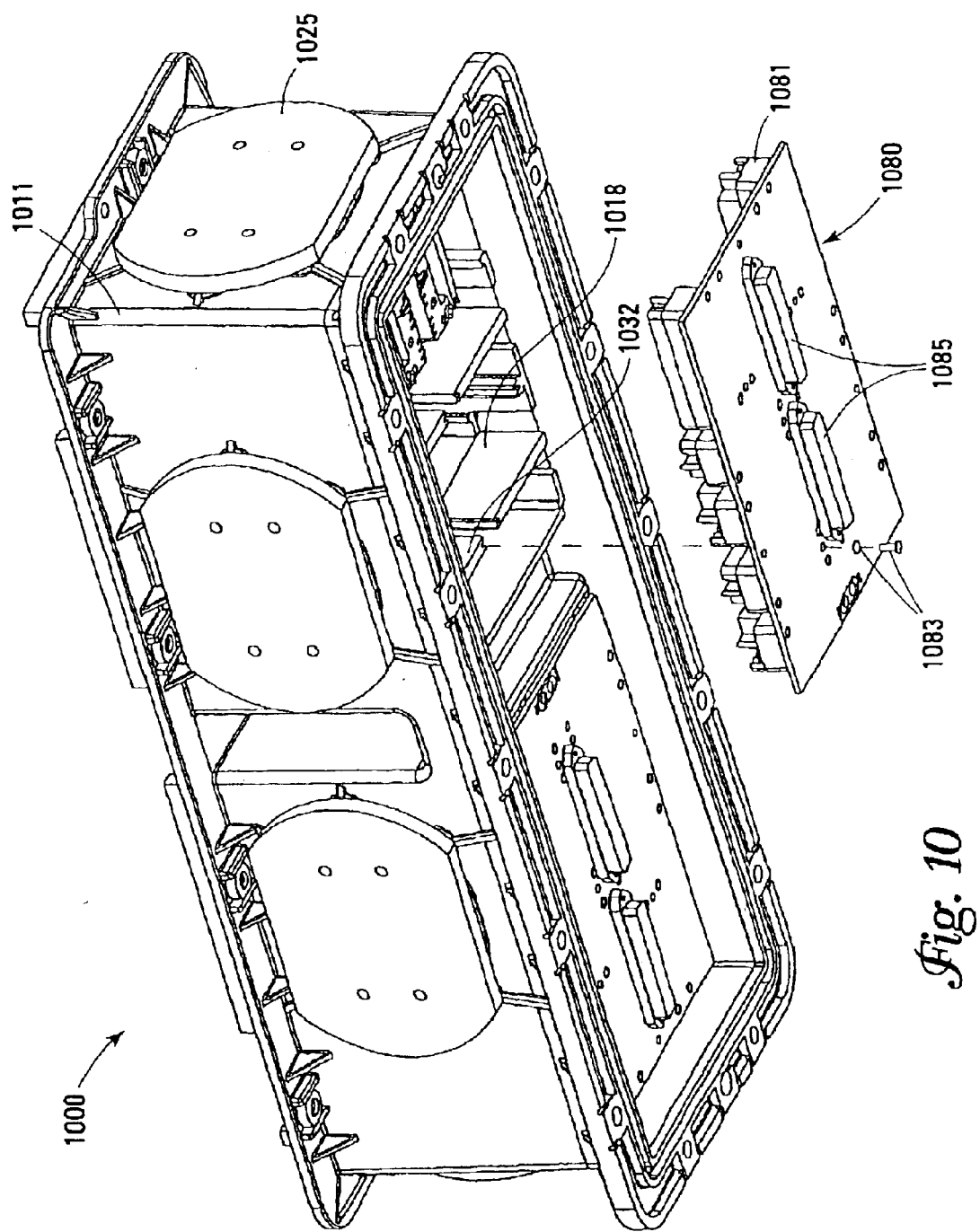
FIG. 10 is an illustration of one embodiment of an electronics equipment enclosure with a backplane according to the teachings of the present invention.

FIG. 10 is an illustration of one embodiment of an electronics equipment enclosure with a backplane, shown generally at 1000, according to the teachings of the present invention. Electronics equipment enclosure 1000 includes frame 1011 having multiple heat transfer modules. Each heat transfer module includes an interface 1025 or an integral interface and heat sink as discussed with respect to FIG. 3 above. Each heat transfer module also includes card cage 1018 coupled to respective interface 1025. Each card cage 1018 includes at least one leg 1032. Leg 1032 includes a channel as described with respect to FIGS. 9a and 9b above. Enclosure 1000 also includes one or more backplanes 1080 adapted to engage with the legs 1032 of one or more card cages 1018. Backplanes 1080 include electrical connectors 1081 adapted to receive at least one electronics card. In one embodiment, backplanes 1080 are fastened to the leg or legs 1032 of card cages 1018 via fastener 1083. In one embodiment, fastener 1083 secures backplane 1080 to card cages 1018 via a channel provided in each leg 1032 of card cages 1018. As a result the secured backplane provides a stable platform for each electronics card to be engaged.

Figure 11:
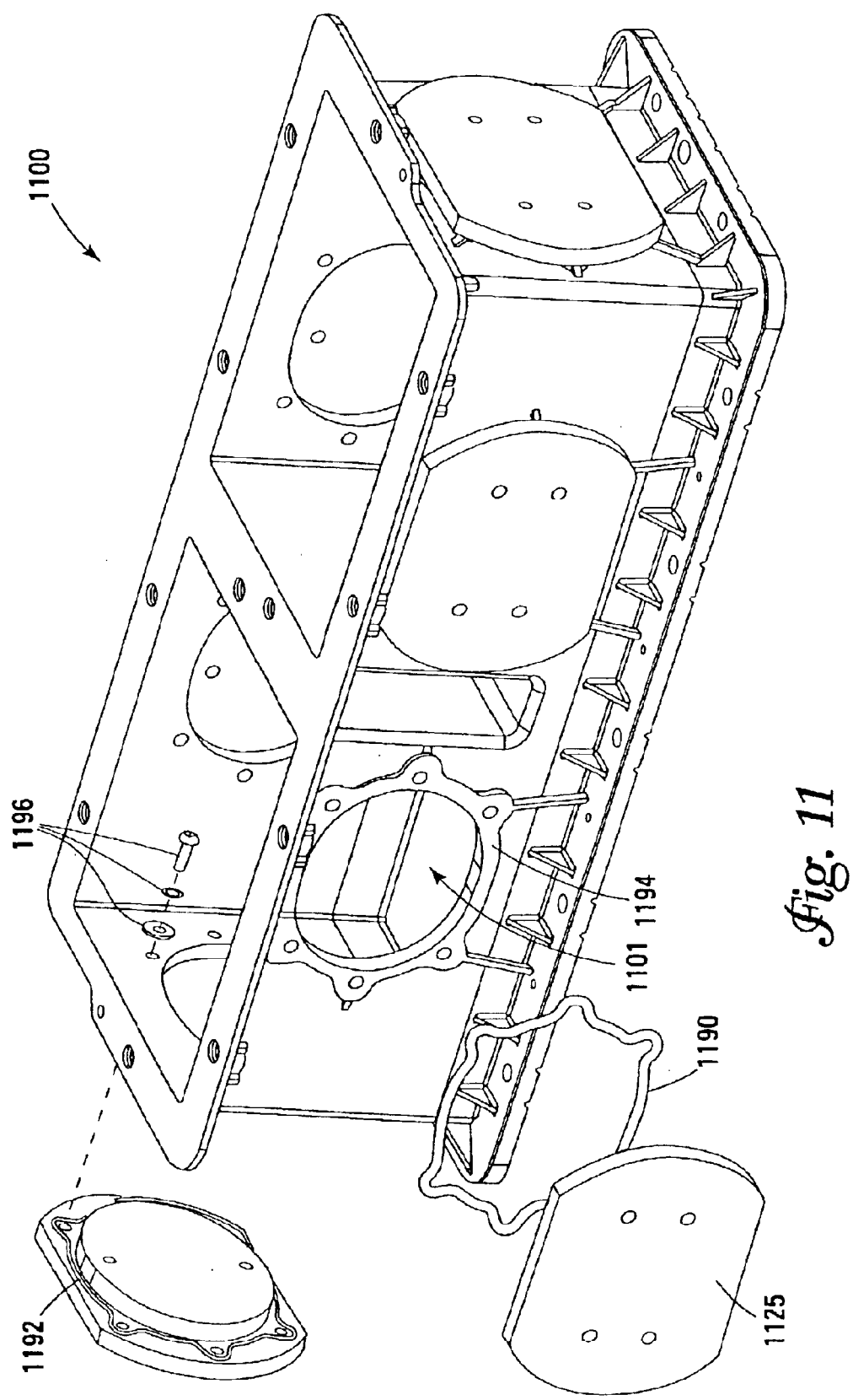
FIG. 11 is an illustration of one embodiment of a frame for an electronics equipment enclosure with modular heat sinks including embedded seals according to the teachings of the present invention.

FIG. 11 is an illustration of one embodiment of a frame for an electronics equipment enclosure having embedded seals, shown generally at 1100, according to the teachings of the present invention. Frame 1100 includes multiple apertures 1101 through which interfaces 1125 extend to couple with card cage 1118. In this embodiment, interfaces 1125 are secured to frame 1100 via one or more mechanical fasteners 1196. In one embodiment, each interface 1125 includes a groove 1192 that is adapted to receive an embedded gasket 1190. Once an interface 1125 is secured to frame 1100 embedded gasket 1190 seals the opening 1101 from the elements and provides a seal against a pressure differential. In one embodiment, embedded gasket 1190 engages with lip 1194 on the exterior of frame 1100.

Figure 12:
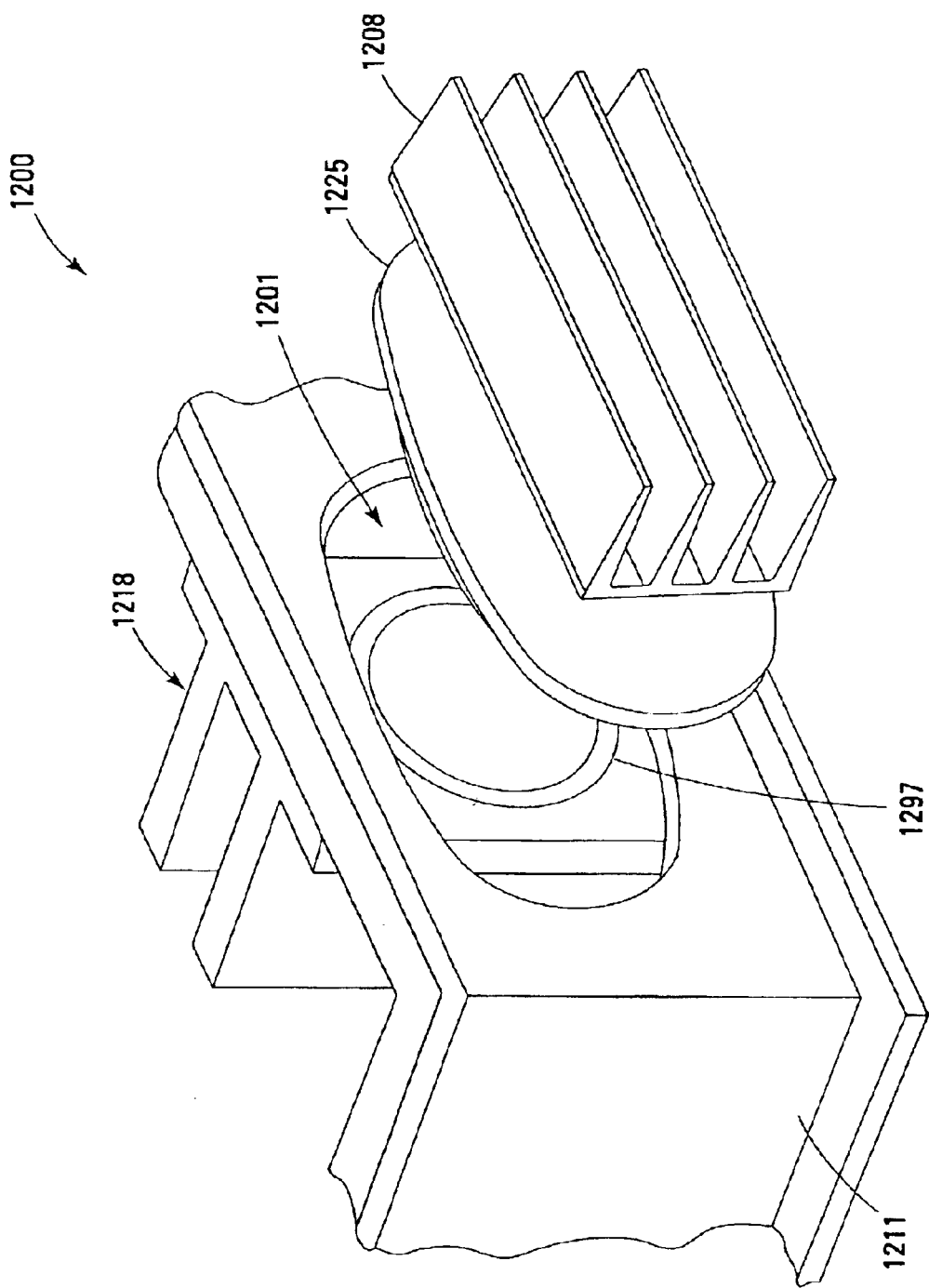
FIG. 12 is an illustration of one embodiment of an expanded view of a frame portion of an electronic equipment enclosure and a modular card cage according to the teachings of the present invention.

FIG. 12 is an illustration of one embodiment of an expanded view of a frame portion of an electronic equipment enclosure, shown generally at 1200, according to the teachings of the present invention. In this embodiment, frame 1211 includes an opening 1201 through a wall of frame 1211. An interface 1225 is adapted to couple with heat sink 1208 and couple with a modular card cage 1218 via opening 1201 to create a heat transfer module. Modular card cage 1218 includes a groove 1297 adapted to receive a seal. Once card cage 1218 is secured to frame 1211 the embedded gasket seals the opening 1201 from the elements and provides a seal against a pressure differential. In one embodiment, interface 1225 and heat sink 1208 are separate components that are adapted to couple together. In another embodiment, interface 1225 and heat sink 1208 are formed as an integral component. Interface 1225, heat sink 1208, and modular card cage 1218 comprise a heat transfer module that provides isolated heat transfers paths for electronics equipment in contact with modular card cage 1218.

Embodiments of the present invention reduce the overall weight of electronics enclosures by replacing single structure card cages with modular card cages and eliminating the need for over molded liners. Over molding large metal parts is a very difficult process not only because of the difference in material shrinkage, but also because of mold operator alignment. Embodiments of the present invention simplify the manufacturing and assembly of electronic housings. The "U" and "E" shaped modular card cages reduce weight and parts in manufacturing as well as allow for independent and fixed compression devices to retain the electronic cards. Embodiments of the present invention provide an environmental and pressure seal to protect and maintain the electronics enclosure as well as allowing field replaceable heat sinks without breaking a seal.

Figure 13:
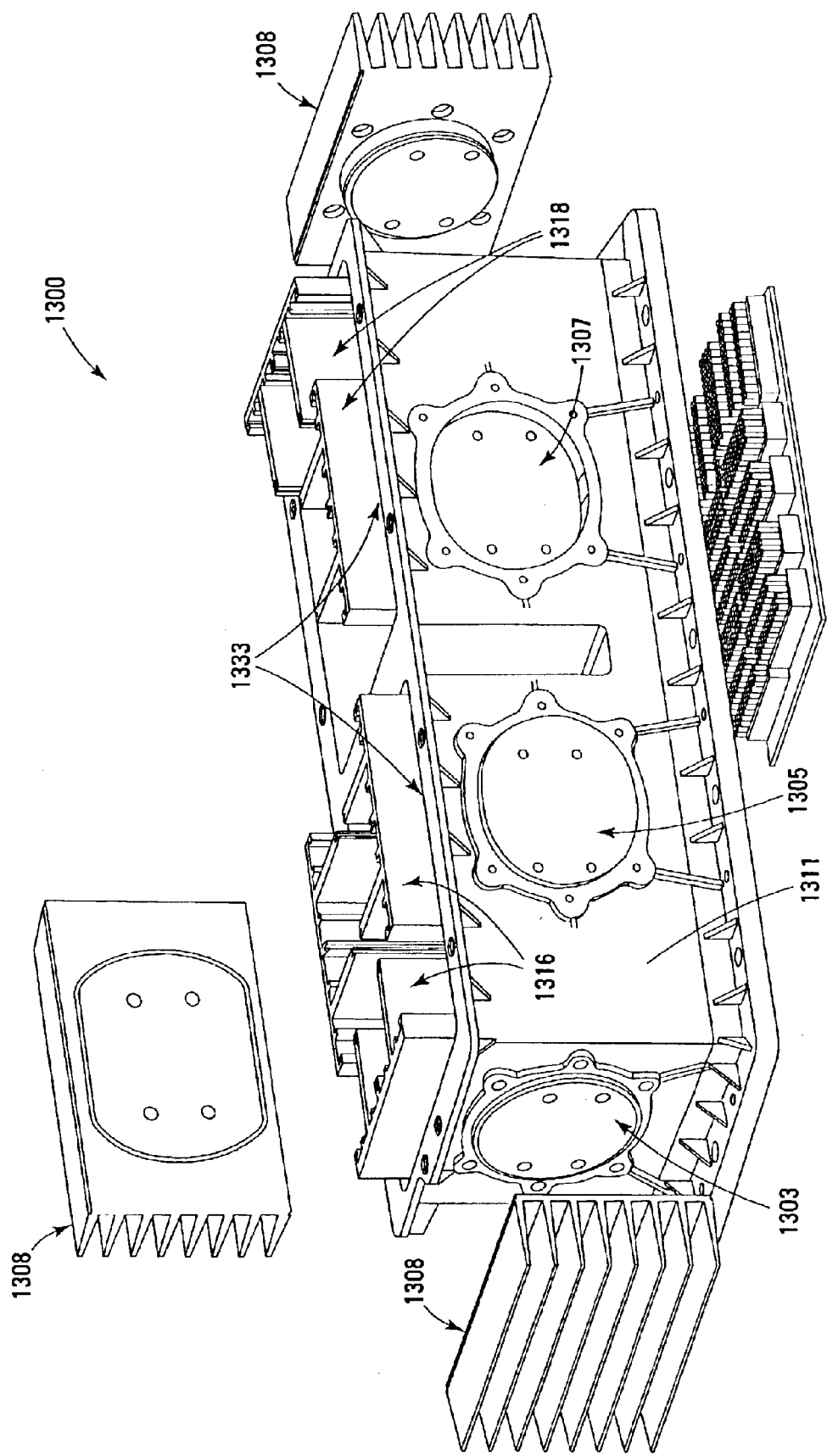
FIG. 13 is an illustration of a portion of one embodiment of an electronics enclosure according to the teachings of the present invention.

FIG. 13 is an illustration of a portion of an electronics enclosure, shown generally at 1300, according to the teachings of the present invention. Electronics enclosure 1300 includes frame 1311 with a plurality of modular card cages 1316 and 1318. Modular card cages 1316 are each adapted to extend through an opening in frame 1311, from the interior to beyond the exterior of frame 1311, and physically and thermally couple to heat sink 1308. Modular card cages 1316 extend past the exterior of frame 1311 as shown by 1303. In one embodiment, modular card cages 1316 provide a gap between card cages 1316 and frame 1311 about the opening in frame 1311 shown at 1305. In one embodiment, modular card cages 1316 seal the interior of frame 1311 from the environment and a pressure differential. Modular card cages 1316 seal to an inner wall of frame 1311 to provide an environmental or pressure seal. The seal does not use the inner wall, or exterior wall for heat distribution.

Heat sinks 1309 are adapted to extend through an opening in frame 1311, from the exterior to the interior of frame 1311, and physically and thermally couple to modular card cage 1318. In one embodiment, there is a gap between heat sink 1309 and frame 1311 once coupled heat sink 1309 is coupled to modular card cage 1318. In this embodiment, heat sink 1309 does not contact frame 1311. In one embodiment, modular card cages 1318 seal the interior of frame 1311 from the environment and a pressure differential. Modular card cages 1318 seal to an inner wall of frame 1311. The seal does not use the inner wall, or exterior wall for heat distribution.

In one embodiment, frame 1311 includes only modular card cages 1316 adapted to couple to heat sinks 1308. In another embodiment, frame 1311 includes only modular card cages 1318 adapted to couple to a plurality of heat sinks 1309. In one embodiment, frame 1311 includes and combination of modular card cages 1316 and 1318 adapted to couple to heat sinks 1308 and 1309, respectively.

Figure 14:
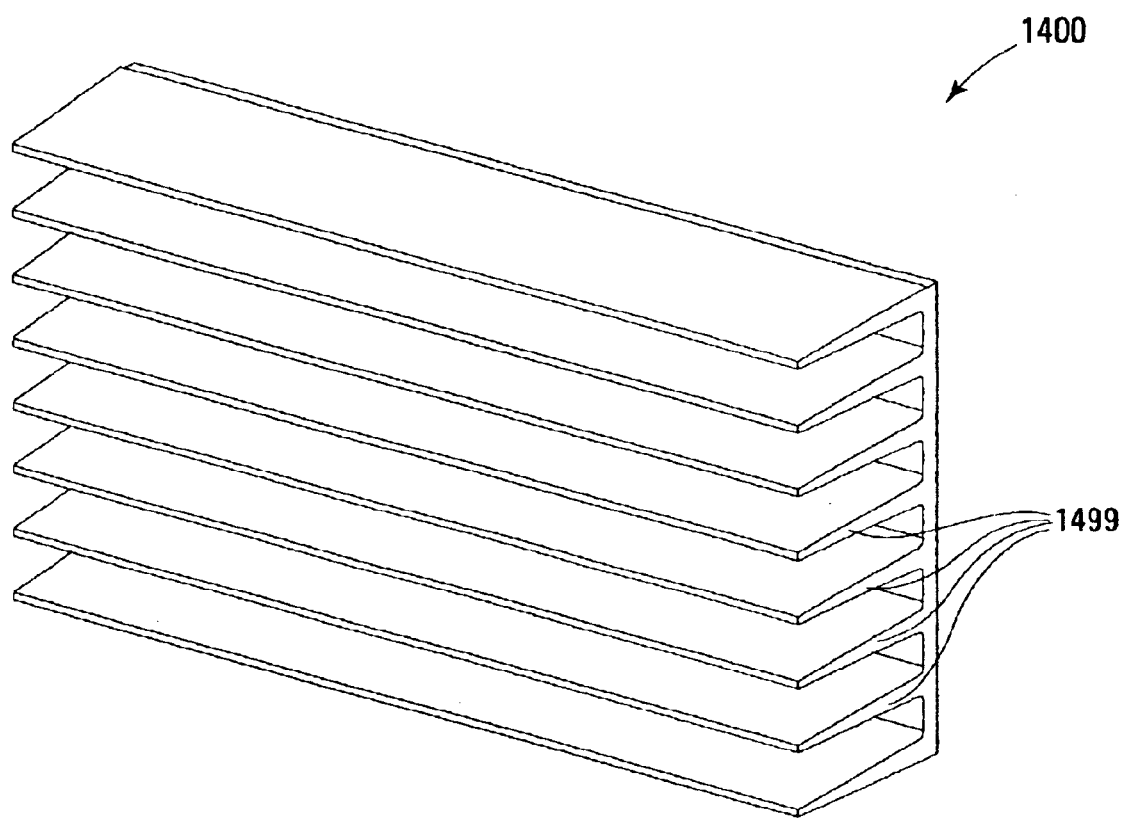
FIG. 14 is an illustration of one embodiment of a heat sink according to the teachings of the present invention.

FIG. 14 is an illustration of one embodiment of a heat sink, shown generally at 1400, according to the teachings of the present invention. Heat sink 1400 is made of a thermally conductive material and includes a plurality of fins 1499 to aid in dispersing heat. Heat sink 1400 may be made of any number of fins 1499 in any orientation.

Figure 15:
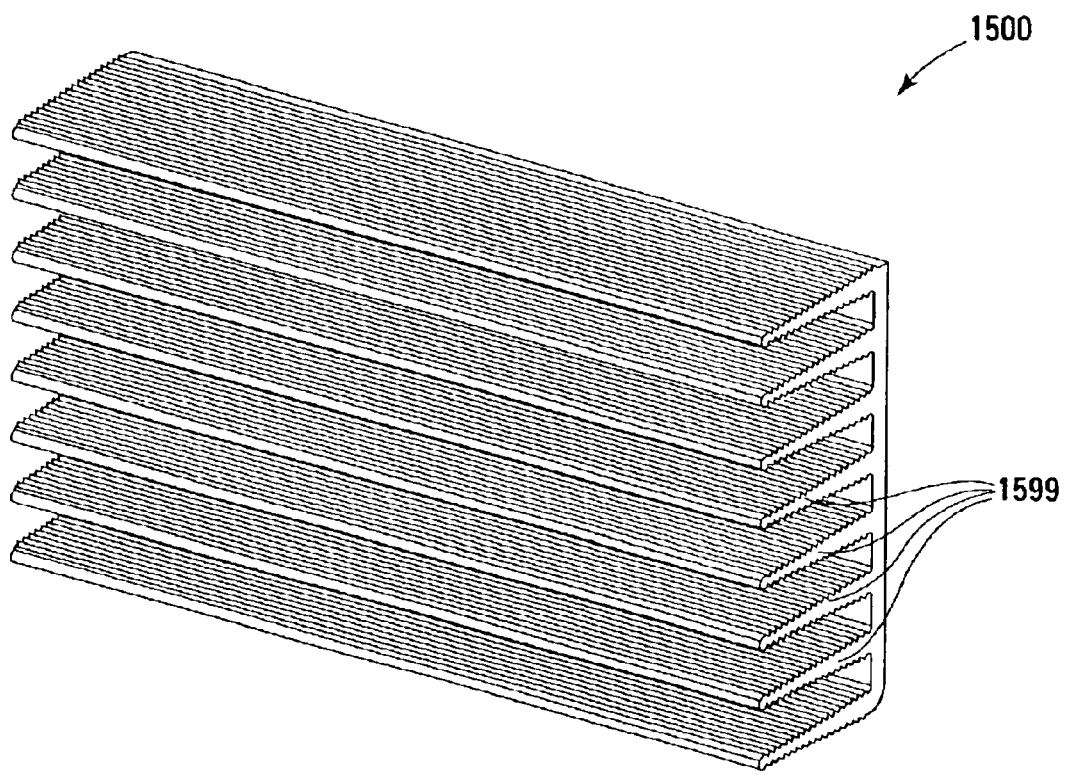
FIG. 15 is an illustration of one embodiment of a heat sink according to the teachings of the present invention.

FIG. 15 is an illustration of another embodiment of a heat sink, shown generally at 1500, according to the teachings of the present invention. Heat sink 1500 is made of a thermally conductive material and includes a plurality of serrated fins 1599. Each fin 1599 includes one or more serrations which aid in the dispersion of heat by providing increased surface area to heat sink 1500.

Figure 16:
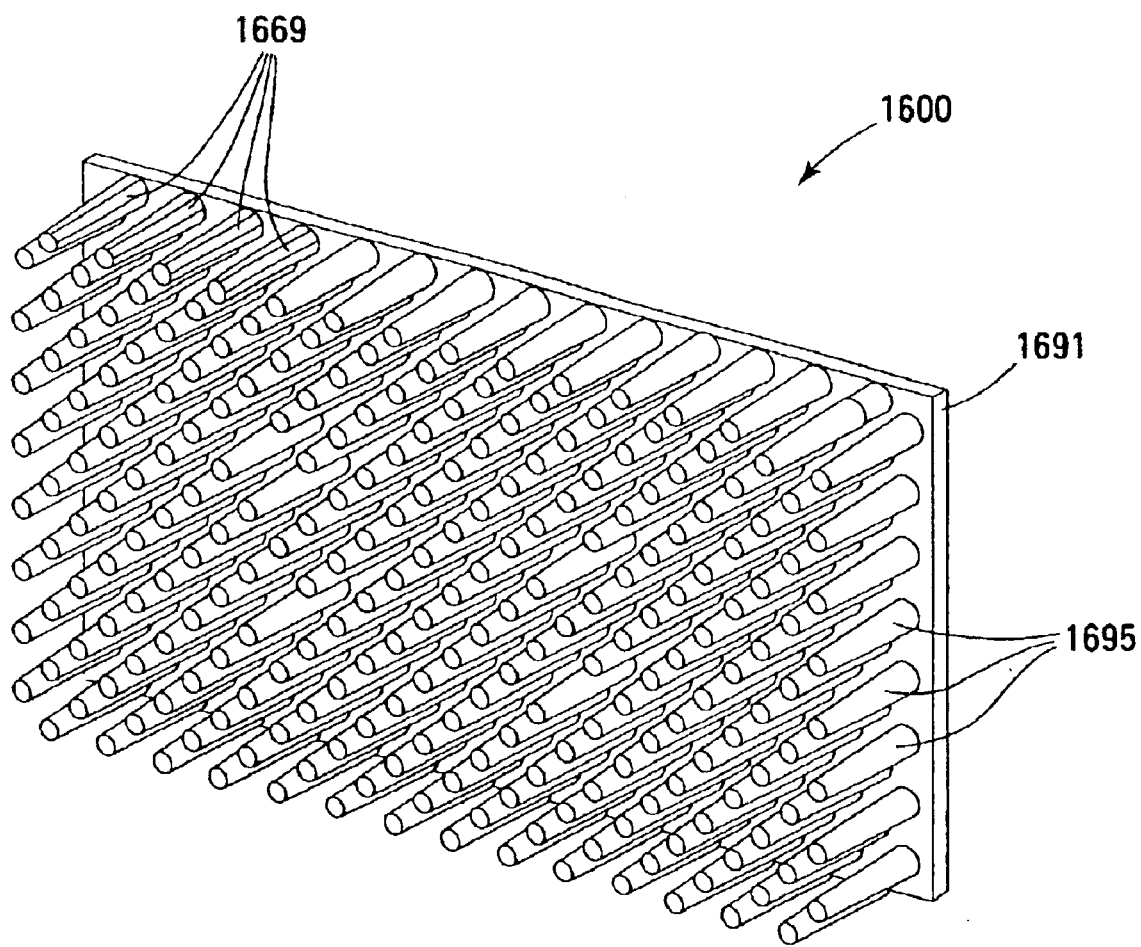
FIG. 16 is an illustration of one embodiment of a heat sink according to the teachings of the present invention.

FIG. 16 is an illustration of another embodiment of a heat sink, shown generally at 1600, according to the teachings of the present invention. Heat sink 1600 is made of a thermally conductive material and includes a base 1691 and a plurality of pins 1695 extended from based 1691. Each pin 1695 aids in the dispersion of heat. In another embodiment, heat sink 1600 includes pins 1695 having serrations 1669.

Figure 17:
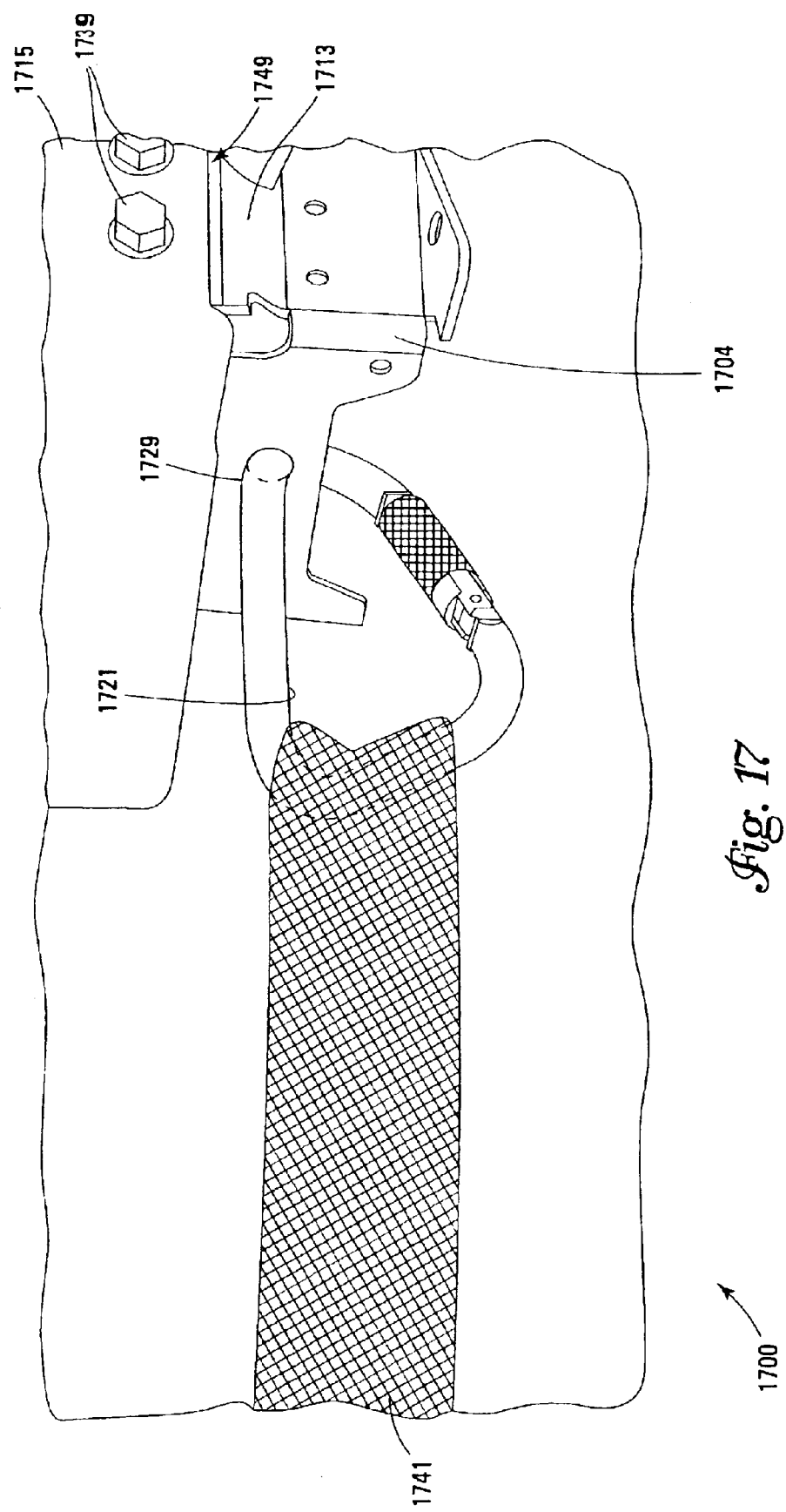
FIG. 17 is an illustration of one embodiment of a lifting detail for an electronics enclosure according to the present invention.

FIG. 17 is an illustration of one embodiment of a lifting detail for an electronics enclosure, shown generally at 1700, according to the present invention. The illustration includes a portion of base 1715 of an equipment enclosure having mounting feet 1713. A lifting bar 1704 spans the width of the base to couple to a pair of mounting feet 1713 and is secured to the mounting fee 1713 and base 1715. Lifting bar 1704 enables the equipment enclosure to be lifted using one or more lifting devices. In one embodiment, a lifting device includes a clasp 1721 attached to a hoisting strap 1741. Lifting bar 1704 includes a slot 1729 for an attachment device such as clasp 1721 to pass through. Slot 1729 can be any shape desired in order to accommodate one or more attachment devices.

In this embodiment, mounting feet 1713 are secured, using one or more fasteners such as bolts, screws or the like, shown as 1739, to base 1715 to form an integral piece. Mounting feet 1713 fit into a slot 1749 behind bolts 1739. Bolts 1739 pass through holes in base 1715 and attach mounting feet 1713 thereto. Unlike many other equipment enclosures that include mounting feet that screw directly into the bottom equipment enclosures, base mounting feet 1713 do not experience direct pull out stress from mounting the equipment enclosure or securing lifting bar 1704 and lifting the equipment enclosure using a hoisting strap. Further with the addition of lifting bar 1704 the strain of the weight of the enclosure is distributed to two mounting feet 1713.

What is claimed is:

1. An electronics enclosure, comprising:
 a modular card cage having a single base and one or more legs adapted to receive one or more electronic circuit cards; and
 a heat sink adapted to protrude through an opening of the enclosure and couple to the modular card cage;
 wherein the modular card cage and the heat sink provide an isolated heat transfer path for heat, produced by each of the one or more electronic circuit cards, to be removed from the enclosure.

2. The enclosure of claim 1, wherein the heat sink comprises an interface and a set of fins for dispersing heat.

3. The enclosure of claim 1, wherein the modular card cage is substantially "U" shaped having two legs.

4. The enclosure of claim 1, wherein the modular card cage is substantially "E" shaped having three legs.

5. The enclosure of claim 3, wherein each leg of the modular card cage is adapted to couple to up to two electronic circuit cards.

6. The enclosure of claim 4, wherein each leg of the modular card cage is adapted to couple to at least one electronic circuit card.

7. The enclosure of claim 2, wherein the enclosure is fabricated of a substantially thermally non-conductive material and the set of fins, the interface and the modular card cage are fabricated of a thermally conductive material.

8. The enclosure of claim 1, wherein the modular card cage is not in direct contact with the electronics enclosure.

9. An electronics enclosure, comprising:
one or more walls having at least one aperture;
a plurality of modular card cages, wherein each card cage, having a single base and one or more legs, is adapted to receive one or more electronics cards; and
a plurality of heat sinks, wherein each heat sink is adapted to protrude through one of the apertures and to couple to one of the plurality of modular card cages;
wherein each aperture provides a direct path through which energy produced by the one or more electronics cards is removed from the enclosure.

10. The enclosure of claim 9, wherein when one of the plurality of heat sinks and one of the plurality of modular card cages are coupled together the heat sink stands-off from the exterior of the enclosure.

11. The enclosure of claim 9, wherein the heat sink comprises an interface and a set of fins for dispersing heat.

12. The enclosure of claim 9, wherein the enclosure is fabricated of a substantially thermally non-conductive material and the heat sink and the modular card cage are fabricated of a thermally conductive material.

13. The enclosure of claim 9, wherein the heat sink includes a plurality of fins.

14. The enclosure of claim 13, wherein each of the plurality of fins is serrated.

15. The enclosure of claim 9, wherein the heat sink includes a plurality of pins.

16. The enclosure of claim 15, wherein the each of the plurality of pins is serrated.

17. A repeater housing, comprising:
a plurality of heat transfer modules, wherein each heat transfer module includes:
a modular card cage, having a single base and one or more legs, adapted to couple with one or more repeaters;
a heat sink adapted to couple with the modular card cage through an opening in a wall of the repeater housing; and
wherein the heat sink and modular card cage are fabricated of a thermally conductive material; and
wherein energy produced by the one or more repeaters is directed out of the repeater housing via isolated heat transfer paths created by the plurality of heat transfer modules.

18. The housing of claim 17, wherein when the heat sink and the modular card cage are coupled together there is a gap between the heat sink and the repeater housing.

19. The housing of claim 17, wherein the heat sink comprises an interface and a set of fins for dispersing heat.

20. The housing of claim 17, wherein the housing is fabricated of a substantially thermally non-conductive material.

21. The housing of claim 17, wherein the isolated heat transfer paths are substantially equal in length.

22. The housing of claim 17, wherein the heat sink includes a plurality of fins.

23. The housing of claim 22, wherein each of the plurality of fins is serrated.

24. The housing of claim 17, wherein the heat sink includes a plurality of pins.

25. The housing of claim 24, wherein the each of the plurality of pins is serrated.

26. A heat transfer module, comprising:
a modular card cage adapted to couple to one or more electronic circuit cards;
a thermal interface adapted to couple with the modular card cage; and
a heat sink integral with the interface;
wherein the heat transfer module provides isolated heat transfer paths from the one or more electronic circuit cards to the heat sink.

27. The heat transfer module of claim 26, further comprising a compression retainer adapted to mate with the modular card cage to provide slots to retain the one or more circuit cards and to maintain the one or more circuit cards in contact with the modular card cage.

28. The heat transfer module of claim 26, wherein the electronic circuit cards comprise repeaters.

29. The heat transfer module of claim 26, wherein the modular card cage is substantially "U" shaped having a base and two legs.

30. The heat transfer module of claim 26, wherein the modular card cage is substantially "E" shaped having a base and three legs.

31. The heat transfer module of claim 29, wherein each leg of the modular card cage is adapted to couple to two electronic circuit cards.

32. The heat transfer module of claim 30, wherein each leg of the modular card cage is adapted to couple to at least one electronic circuit card.

33. The heat transfer module of claim 26, wherein the heat transfer module is fabricated of a thermally conductive material.

34. The heat transfer module of claim 26, wherein the heat sink includes a plurality of fins.

35. The heat transfer module of claim 34, wherein each of the plurality of fins is serrated.

36. The heat transfer module of claim 26, wherein the heat sink includes a plurality of pins.

37. The heat transfer module of claim 36, wherein the each of the plurality of pins is serrated.

38. A repeater housing, comprising:
a plurality of heat transfer modules, wherein each heat transfer module, includes:
a modular card cage adapted to couple with one or more electronic circuit cards;
a compression retainer adapted to mate with the modular card cage to provide slots to retain the one or more circuit cards and to maintain the one or more circuit cards in contact with the modular card cage;

an interface adapted to couple to the modular card cage through an aperture in a wall of the repeater housing; and a heat sink integral to the interface;

wherein each of the heat transfer modules provides isolated heat transfer paths from the one or more electronic circuit cards to the exterior of the repeater housing.

39. The repeater housing of claim 38, wherein the one or more electronic circuit cards are repeaters.

40. The repeater housing of claim 38, wherein one or more of the plurality of modular card cages are substantially "U" shaped having a base and two legs.

41. The repeater housing of claim 38, wherein one or more of the plurality of modular card cages are substantially "E" shaped having a base and three legs.

42. The repeater housing of claim 38, wherein each leg of the one or more of the plurality of modular card cages is adapted to couple to up to two electronic circuit cards.

43. The repeater housing of claim 41, wherein each leg of the one ore more of the plurality of modular card cages is adapted to couple to at least one electronic circuit card.

44. The repeater housing of claim 38, wherein the plurality of heat transfer modules are fabricated of a thermally conductive material.

45. The repeater housing of claim 38, wherein the heat sink includes a plurality of fins.

46. The repeater housing of claim 45, wherein one or more of the plurality of fins is serrated.

47. The repeater housing of claim 38, wherein the heat sink includes a plurality of pins.

48. The repeater housing of claim 47, wherein one or more of the plurality of pins is serrated.

49. A repeater housing, comprising:

at least one modular card cage adapted to couple with one or more electronic cards;

a heat sink adapted to couple with the modular card cage through a wall of the repeater housing, wherein the heat sink and modular card cage are fabricated of a thermally conductive material and wherein when the heat sink interfaces with the modular card cage a gap between the heat sink and the repeater housing is produced; and wherein the modular card cage and the heat sink provide an isolated heat transfer path from each of the one or more electronic cards to the exterior of the repeater housing.

50. The repeater housing of claim 49, wherein the heat sink includes an interface adapted to couple to the at least one modular card cage through an aperture in the repeater housing.

51. An electronics enclosure, comprising:

a frame having at least one chamber;

at least one lid adapted to couple to the frame to form a seal from the environment and against a pressure differential;

a plurality of openings in one or more end and side walls of the frame, wherein each opening provides an aperture for energy expended by electronics equipment stored within the enclosure to be removed from the enclosure;

a plurality of modular card cages, each card cage adapted to receive one or more electronic circuit cards;

a plurality of heat sinks, each heat sink including an interface adapted to protrude through one of the plurality of openings, from the exterior to the interior of the electronics enclosure, and couple to one of the plurality of modular card cages; and wherein the length of each path from the one or more electronics circuit cards to air ambient to the electronics enclosure is substantially equivalent.

52. The enclosure of claim 51, further comprising at least one base adapted to couple to the frame to form a seal from the environment and against a pressure differential.

53. The enclosure of claim 51, further comprising at least one back plane adapted to couple to each of the plurality of modular card cages and adapted to electrically couple to each of the electronic circuit cards.

54. The enclosure of claim 51, further comprising at least one pair of mounting feet attached to the at least one base.

55. The enclosure of claim 54, further comprising a lifting bar coupled to the at least one pair of mounting feet and spanning the width of the at least one base.

56. The enclosure of claim 55, wherein the lifting bar includes a slot for an attachment device to pass through.

57. The enclosure of claim 54, wherein each of the mounting feet fit into a slot formed in the at least one base.

58. The enclosure of claim 57, wherein each of the mounting feet are secured to the at least one base by passing a fastener through the exterior of the at least one base through the slot and the mounting foot.

59. An enclosure comprising:

a plurality of card cages adapted to transfer energy from one or more electronic cards to an interface, wherein the plurality of card cages is fabricated of a thermally conductive material;

a compression retainer adapted to couple to each of the plurality of card cages and form slots that are adapted to receive the electronic cards, wherein the slots are also adapted to retain and force the electronic cards into contact with the card cage; and wherein each of the plurality of card cages provides an isolated heat transfer path from each of the one or more electronic cards to a heat sink beyond the exterior of the enclosure.

60. The enclosure of claim 59, wherein the compression retainer is adapted to couple to one of the plurality of card cages.

61. A method of extracting heat from a sealed electronics equipment enclosure, comprising:

moving energy produced by one or more electronic cards, enclosed within the electronics equipment enclosure, to one or more heat sinks via a heat transfer module;

wherein the heat transfer module is comprised of a modular card cage coupled to a heat sink and the one or more electronics cards are in contact with the modular card cage; wherein the heat sink is not in contact with the equipment enclosure cage; and dissipating the energy to air ambient to the electronics equipment enclosure.

62. The method of claim 61, further comprising engaging a compression retainer with the modular card cage and forcing the one or more electronic cards in contact with a leg of the modular card cage.

63. An enclosure comprising, a plurality of card cages; and a compression retainer adapted to couple to each of the plurality of card cages and to form one or more slots that are each adapted to receive an electronic circuit card;

wherein the compression retainer further forces the electronic circuit card in contact with a leg of one of the plurality of card cages.

64. The enclosure of claim 63, wherein the compression retainer includes a plurality of pressure protrusions adapted to engage with and hold each electronic circuit card in contact with the leg of one of the plurality of card cages.

65. The enclosure of claim 63, wherein the compression retainer includes at least one retaining clip adapted to hold the electronic card in the slot.

66. The enclosure of claim 63, wherein each of the plurality of card cages includes two channels that extend a portion of the length of the card cage, wherein each channel is adapted to receive a tab extension formed on the end of a wall of the compression retainer.

67. The enclosure of claim 63, wherein the compression retainer includes one or more force fit flanges that mate with a groove formed in a leg of the card cage.

68. The enclosure of claim 63, wherein the compression retainer is substantially "U" shaped and the inner walls of each leg of the "U" shaped compression retainer includes protrusions adapted to engage with and force the electronic card in contact with a leg of the card cage.

69. The enclosure of claim 68, wherein the "U" shaped compression retainer forces up to two electronic cards in contact with a leg of the card cage.

70. A method of creating an isolated heat transfer path, comprising:
passively contacting one or more electronic circuit cards with a leg of a modular card cage, wherein the modular card cage includes a base coupled to one or more parallel legs, wherein the parallel legs are substantially perpendicular to the base;
coupling the modular card cage to a heat sink that protrudes through an opening in a wall of a thermally non-conductive electronic enclosure; and
drawing energy from the one or more electronic cards to the exterior of the thermally non-conductive electronic enclosure via the modular card cage and heat sink.

71. The method of claim 70, further comprising sealing the modular card cage to the interior of the thermally non-conductive electronic enclosure.

72. The method of claim 70, wherein sealing the modular card cage comprises embedding a gasket within the base of the card cage and coupling the base to the interior of the thermally non-conductive electronic enclosure.

73. The method of claim 70, further comprising sealing the heat sink to the exterior of the thermally non-conductive electronic enclosure.

74. The method of claim 73, wherein sealing the heat sink comprises embedding a gasket within the heat sink.

75. A method for transferring heat from a circuit card, the method comprising:
conducting heat from the circuit card to a card cage that is in contact with the circuit card; and
conducting the heat from the card cage to a heat sink, wherein the heat sink is in contact with the card cage and extends through an aperture in a housing containing the card cage from an exterior to an interior of the housing, wherein the card cage is removably attached to the housing so as to seal the aperture against a pressure differential.

76. A method of manufacturing an electronics enclosure, comprising:
forming a modular card cage adapted to receive one or more electronic circuit cards; and
forming a heat sink adapted to protrude through an opening in the enclosure and coupled to the modular card cage, wherein the heat sink is not in direct contact with the enclosure;
wherein the modular card cage and the heat sink provide an isolated heat transfer path for heat, produced by each of the one or more electronic circuit cards, to be removed from the enclosure.

77. The method of claim 76, further comprising forming the heat sink comprising an interface coupled to a set of fins for dispersing heat.

78. The method of claim 76, wherein forming a modular card cage comprises forming a substantially "U" shaped modular card cage having a base and two legs.

79. The method of claim 76, wherein forming a modular card cages comprises forming a substantially "E" shaped modular card cage having a base and three legs.

80. The method of claim 78, wherein each leg of the modular card cage is adapted to couple to up to two electronic circuit cards.

81. The method of claim 79, wherein each leg of the modular card cage is adapted to couple to at least one electronic circuit card.

82. The method of claim 76, wherein the enclosure is formed from a substantially thermally non-conductive material and the heat sink and the modular card cage are formed from a thermally conductive material.

83. A method of manufacturing an electronics enclosure, comprising:
forming a plurality of apertures through one or more walls of the enclosure;
forming a plurality of modular card cages, wherein each card cage is adapted to receive one or more electronics cards; and
forming a plurality of heat sinks, wherein each heat sink protrudes through one of the apertures and is adapted to couple to one of the plurality of modular card cages, wherein when one of the plurality of heat sinks and one of the plurality of modular card cages are coupled together the heat sink stands-off from the exterior of the enclosure;
wherein one of the plurality of modular card cages coupled to one of the plurality of heat sinks provides isolated heat transfer paths through which energy produced by the one or more electronics cards is removed.

84. The method of claim 83, wherein forming a plurality of heat sinks comprises forming a plurality of heat sinks comprising an interface adapted to couple to a set of fins for dispersing heat.

85. The method of claim 83, wherein the enclosure is fabricated of a substantially thermally non-conductive material and the plurality of modular card cages and the plurality of heat sinks are fabricated of a thermally conductive material.

86. The method of claim 83, wherein the heat sink includes a plurality of fins.

87. The method of claim 86, wherein one or more of the plurality of fins is serrated.

88. The method of claim 83, wherein the heat sink includes a plurality of pins.

89. The method of claim 88, wherein one or more of the plurality of pins is serrated.

90. A method of manufacturing a heat transfer module, comprising:
forming a modular card cage adapted to couple with one or more electronic circuit cards;
forming a compression retainer adapted to mate with the modular card cage to provide slots to retain the one or more circuit cards and to maintain the one or more circuit cards in contact with the modular card cage;

forming an interface adapted to couple to the modular card cage; and forming a heat sink integral with the interface;

wherein the heat transfer module provides isolated heat transfer paths from the one or more electronic circuit cards to the heat sink for dispersion.

91. The method of claim 90, wherein forming a modular card cage comprises forming a substantially "U" shaped modular card cage having a base and two legs.

92. The method of claim 90, wherein forming a modular card cages comprises forming a substantially "E" shaped modular card cage having a base and three legs.

93. The method of claim 90, wherein the heat transfer module is fabricated of a thermally conductive material.

94. The method of claim 90, wherein the heat sink includes a plurality of fins.

95. The method of claim 94, wherein one or more of the plurality of fins is serrated.

96. The method of claim 90, wherein the heat sink includes a plurality of pins.

97. The method of claim 96, wherein one or more of the plurality of pins is serrated.

* * * * *